(12) United States Patent
Sasago et al.

(10) Patent No.: US 10,734,422 B2
(45) Date of Patent: Aug. 4, 2020

(54) SEMICONDUCTOR APPARATUS HAVING A RESET TRANSISTOR FOR RESETTING A POTENTIAL IN A SEMICONDUCTOR REGION

(71) Applicant: CANON KABUSHIKI KAISHA, Tokyo (JP)

(72) Inventors: Tomoya Sasago, Kawasaki (JP); Kazuaki Tashiro, Isehara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/241,251

(22) Filed: Jan. 7, 2019

(65) Prior Publication Data

US 2019/0221594 A1    Jul. 18, 2019

(30) Foreign Application Priority Data

Jan. 16, 2018 (JP) ................. 2018-004913

(51) Int. Cl.
| | |
|---|---|
| H01L 27/146 | (2006.01) |
| H04N 5/378 | (2011.01) |
| H04N 5/3745 | (2011.01) |
| H04N 5/374 | (2011.01) |

(52) U.S. Cl.
CPC .... *H01L 27/14612* (2013.01); *H01L 27/1461* (2013.01); *H01L 27/14643* (2013.01); *H01L 27/14665* (2013.01); *H04N 5/374* (2013.01); *H04N 5/378* (2013.01); *H04N 5/3745* (2013.01)

(58) Field of Classification Search
CPC .......... H01L 27/14612; H01L 27/1461; H01L 27/14643; H01L 27/14665; H04N 5/374; H04N 5/3745; H04N 5/378
See application file for complete search history.

(56) References Cited

U.S. PATENT DOCUMENTS

| | | |
|---|---|---|
| 2012/0200752 A1 | 8/2012 | Matsunaga |
| 2019/0098236 A1* | 3/2019 | Tashiro .................. H04N 5/343 |

FOREIGN PATENT DOCUMENTS

| | | |
|---|---|---|
| JP | 2001-332714 A | 11/2001 |
| JP | 2003-087663 A | 3/2003 |
| JP | 2006-173488 A | 6/2006 |
| JP | 2016-51813 A | 4/2016 |
| WO | 2011/058684 A1 | 5/2011 |

* cited by examiner

*Primary Examiner* — Nicholas G Giles
(74) *Attorney, Agent, or Firm* — Canon U.S.A., Inc. IP Division

(57) ABSTRACT

There is provided a semiconductor apparatus including a first semiconductor region of a first conductive type in which a potential to be detected appears, a second semiconductor region of a second conductive type forming a p-n junction with the first semiconductor region, an amplification transistor including a gate to which the first semiconductor region is connected, and a reset transistor configured to reset a potential of the first semiconductor region. In the semiconductor apparatus, one of a source and a drain of the reset transistor is connected to the first semiconductor region, and the other one of the source and the drain of the reset transistor is connected to the second semiconductor region.

20 Claims, 13 Drawing Sheets

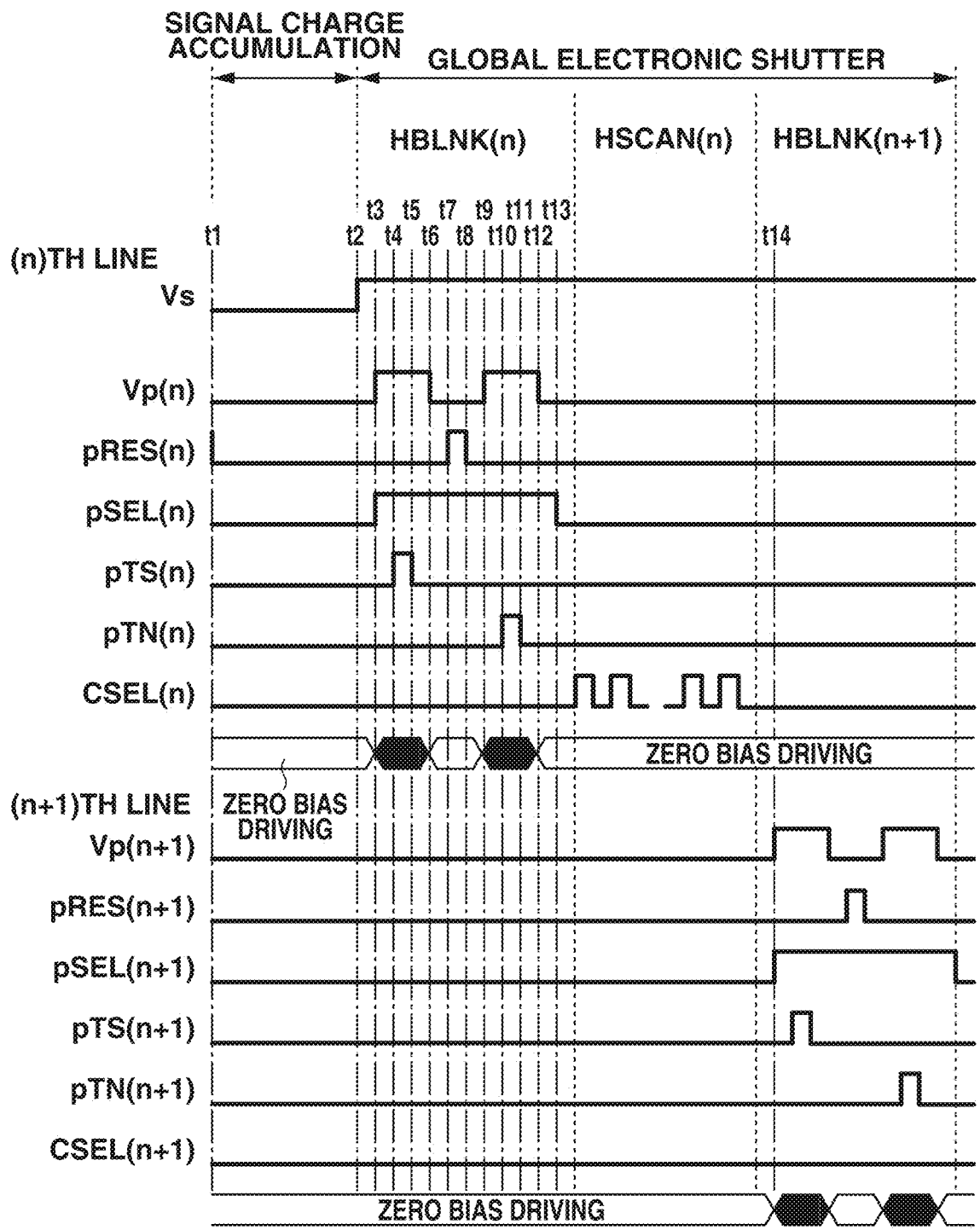

SEMICONDUCTOR APPARATUS HAVING A RESET TRANSISTOR FOR RESETTING A POTENTIAL IN A SEMICONDUCTOR REGION

BACKGROUND OF THE INVENTION

Field of the Invention

The aspect of the embodiment relates to a semiconductor apparatus.

Description of the Related Art

A semiconductor apparatus used as an image sensor of a camera includes a reset transistor configured to reset a potential of a node connected to an amplification transistor. WO 2011/058684 discusses a solid-state imaging equipment in which a zero bias capacitor is connected to a gate of an amplification transistor.

A solid-state imaging equipment discussed in WO 2011/058684 has an issue that an output signal of an amplification transistor 106 varies due to a variation in a reset transistor or reset voltage.

SUMMARY OF THE INVENTION

According to an aspect of the embodiment, a semiconductor apparatus includes a first semiconductor region of a first conductive type in which a potential to be detected appears, a second semiconductor region of a second conductive type which forms a p-n junction with the first semiconductor region, an amplification transistor including a gate to which the first semiconductor region is connected, and a reset transistor configured to reset a potential of the first semiconductor region, wherein one of a source and a drain of the reset transistor is connected to the first semiconductor region, and another one of the source and the drain of the reset transistor is connected to the second semiconductor region.

Further features of the disclosure will become apparent from the following description of exemplary embodiments with reference to the attached drawings.

BRIEF DESCRIPTION OF THE DRAWINGS

FIGS. 6A and 6B are schematic diagrams illustrating a semiconductor apparatus.

DESCRIPTION OF THE EMBODIMENTS

Figure 1A:
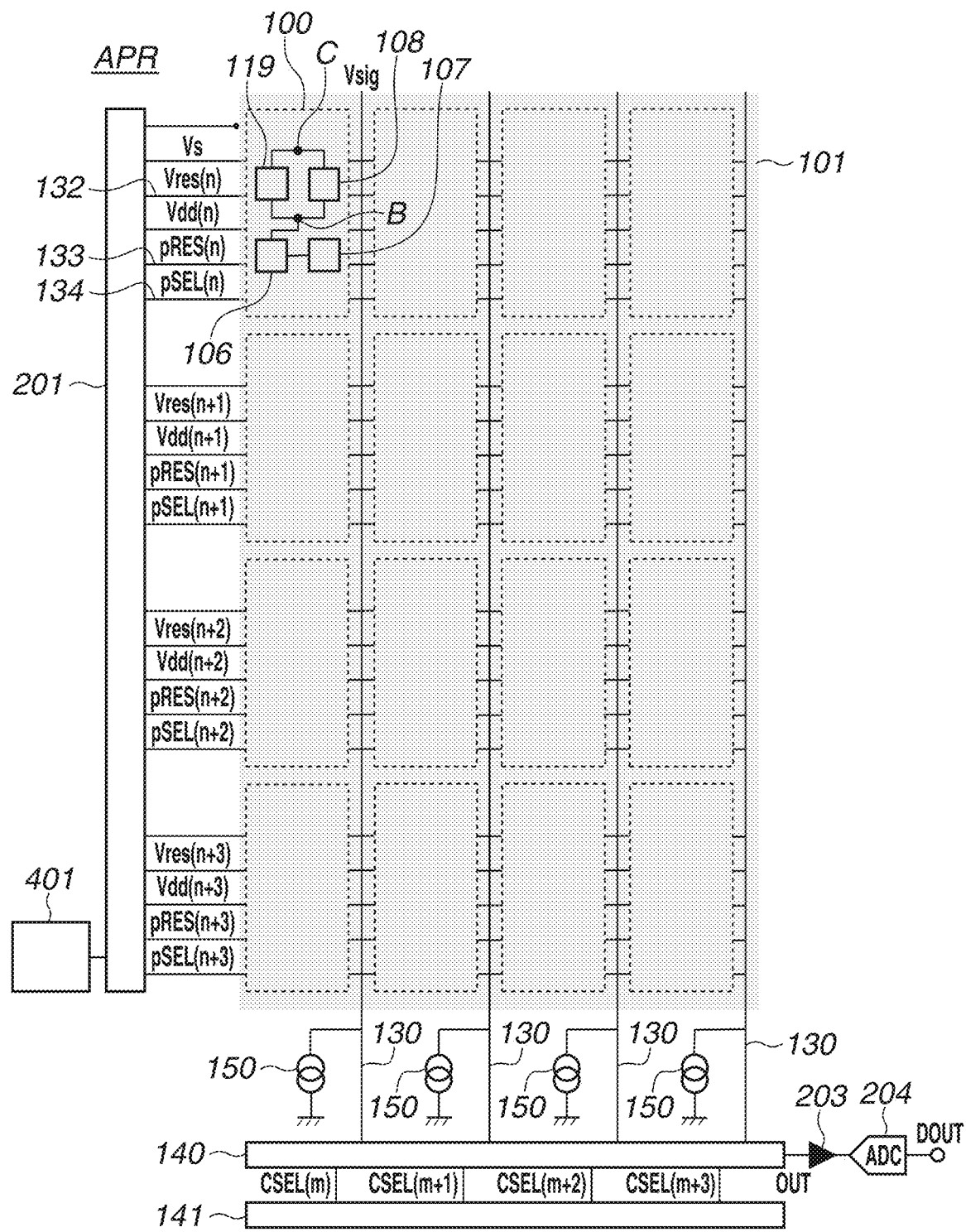
FIGS. 1A and 1B are schematic diagrams illustrating a semiconductor apparatus.

Various exemplary embodiments of the disclosure will be described below with reference to the drawings. Further, exemplary embodiments of the disclosure are not limited to those described below. The below-described exemplary embodiments in which a structure is partly changed within the spirit of the disclosure are also encompassed within the scope of the disclosure. Further, exemplary embodiments in which part of a structure in one of the below-described exemplary embodiments is added to another one of the exemplary embodiments or replaced by part of a structure in another one of the exemplary embodiments are also encompassed within the scope of the disclosure. In the descriptions below and the drawings, a common reference numeral is given to a common structure across a plurality of drawings. Further, a common structure is sometimes described with reference to a plurality of drawings without notice. Further, a description of a structure that is given a common reference number is sometimes omitted.

FIG. 1A is a diagram schematically illustrating an entire circuit configuration of a semiconductor apparatus APR according to a first exemplary embodiment. FIG. 1A illustrates 16 pixels 100 arranged in an array of four rows and four columns. Each one of the pixels 100 is a unit including a diode 119, a reset transistor 108, an amplification transistor 106, and a selection transistor 107. The selection transistor 107 of the pixel 100 does not have to be located in the pixel 100. The plurality of pixels 100 included in one column is connected to one output signal line 130. While the selection transistor 107 is connected to the output signal line 130 in the present exemplary embodiment, in a case in which the selection transistor 107 is omitted, the amplification transistor 106 is connected to the output signal line 130.

A driving voltage Vs is supplied from a row driving circuit 201 to a common electrode 101 provided to each row. From the row driving circuit 201 to the pixel 100 in each row, a potential supply line (Vres line) 132, a reset signal line (pRES line) 133, and a row selection signal line (pSEL line) 134 are provided. The potential supply line (Vres line) 132 is a wiring line that transmits a potential to be supplied to a node C of the reset transistor 108. The reset signal line (pRES line) 133 is a wiring line that transmits a reset signal pRES. The row selection signal line (pSEL line) 134 is a wiring line that transmits a row selection signal pSEL. Each of the wiring lines is a conductive member containing metal, such as aluminum, copper, and/or tungsten, as a main component. The reset signal pRES is supplied to a gate of the reset transistor 108 in the pixel 100. The reset signal pRES resets a node B in the pixel 100 to a reset voltage Vres. In the present exemplary embodiment, the reset voltage Vres is supplied from a potential supplier 170, and the voltage value of the reset voltage Vres is controlled so as to execute pixel resetting and zero bias resetting.

The row selection signal pSEL is supplied to a gate of the selection transistor 107 in the pixel 100. The row selection signal pSEL controls the selection transistor 107. A plurality of the pixels 100 included in one row is connected to a common reset signal line and a driving signal line. In FIG. 1A, in order to discriminate the driving signals supplied to different rows, reference symbols such as "(n)" and "(n+1)" each indicating a row are given. The same applies to the other drawings.

FIG. 1A schematically illustrates a planar structure of the common electrode 101 of a photoelectric conversion portion 120. A terminal of the photoelectric conversion portion 120 of each of the plurality of pixels 100 is formed by the common electrode 101. The common electrode 101 forms a node A of the photoelectric conversion portion 120. As illustrated in FIG. 1A, in the present exemplary embodiment, the driving voltage Vs is a fixed voltage during a rolling shutter operation. Further, the driving voltage Vs is controlled based on a driving mode during a global shutter operation.

Each output signal line 130 is connected to a column circuit 140. A column driving circuit 141 drives the column circuit 140 column by column. More specifically, the column driving circuit 141 supplies a driving signal CSEL to the plurality of column circuits 140. In order to distinguish the driving signals supplied to different columns, reference symbols such as "(m)" and "(m+1)" each indicating a column are given. The same applies to the other drawings. With this structure, the signals that are read in parallel in the respective rows are sequentially output to an amplification unit 203 and an analog-to-digital conversion (ADC) unit 204.

Figure 1B:
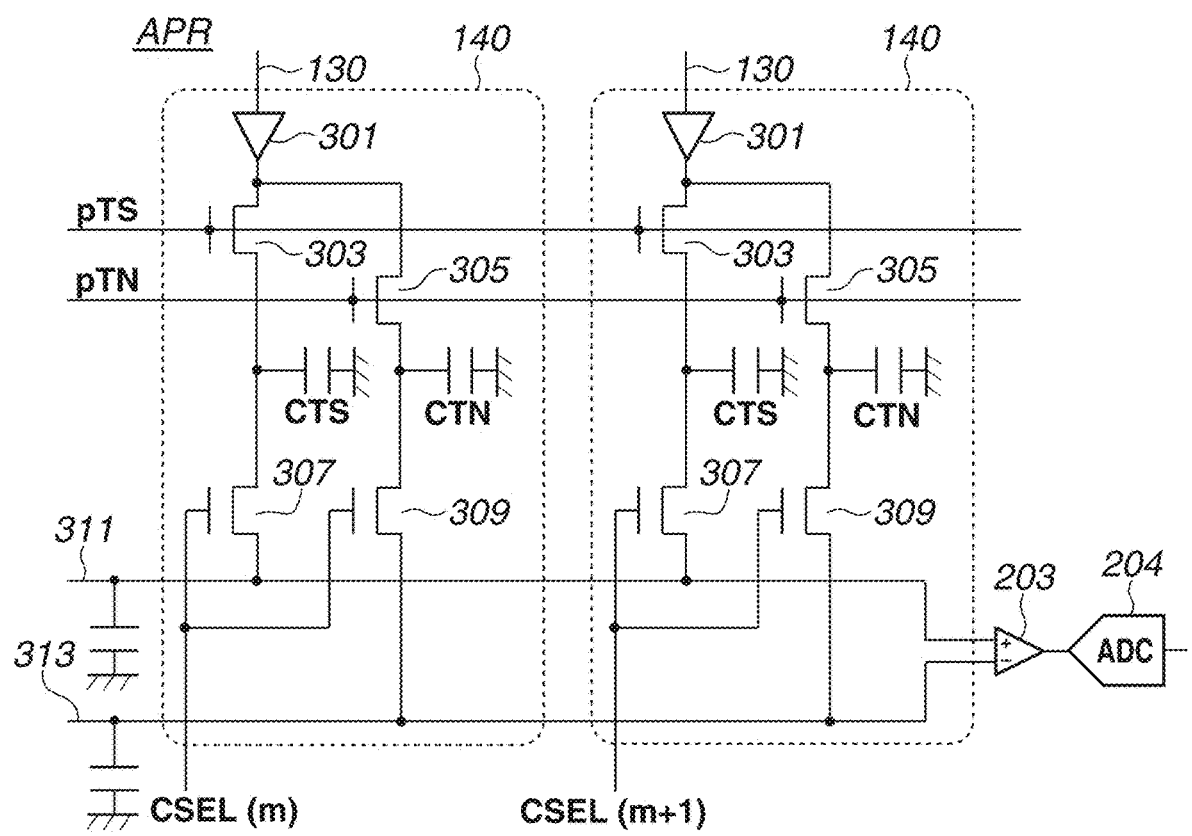

Next, the column circuit 140 is described, but the structure of the column circuit 140 is a mere example. FIG. 1B illustrates an equivalent circuit of the (m)th and (m+1)th column circuits 140. The column circuits 140 of the other columns are not illustrated. The signal of the output signal line 130 is amplified by a column amplifier 301. An output node of the column amplifier 301 is connected to a capacitor CTS via a S/H switch 303. Further, the output node of the column amplifier 301 is connected to a capacitor CTN via a S/H switch 305. The S/H switches 303 and 305 are respectively controlled by driving signals pTS and pTN. With this structure, the capacitor CTN holds a dark level signal (noise signal) N containing a threshold value variation of the amplification transistor 106, and the capacitor CTS holds an optical signal S containing a threshold value variation of the amplification transistor 106.

The capacitor CTS is connected to a horizontal signal line 311 via a horizontal transfer switch 307. The capacitor CTN is connected to a horizontal signal line 313 via a horizontal transfer switch 309. The horizontal transfer switches 307 and 309 are controlled by the driving signal CSEL from the column driving circuit 141.

The horizontal signal lines 311 and 313 are each connected to the amplification unit 203. The amplification unit 203 outputs a difference between the signals of the horizontal signal lines 311 and 313 to the ADC unit 204. The difference between the signals S and N is obtained to thereby remove the threshold value variations of the amplification transistor 106. The ADC unit 204 converts the input analog signal into a digital signal.

The column circuit 140 may be an analog-digital conversion circuit. In this case, the analog-digital conversion circuit includes a holding unit configured to hold a digital signal of a memory or counter. The holding unit holds a noise signal and an optical signal that are converted into a digital signal, and the noise signal converted into a digital signal.

Figure 2A:
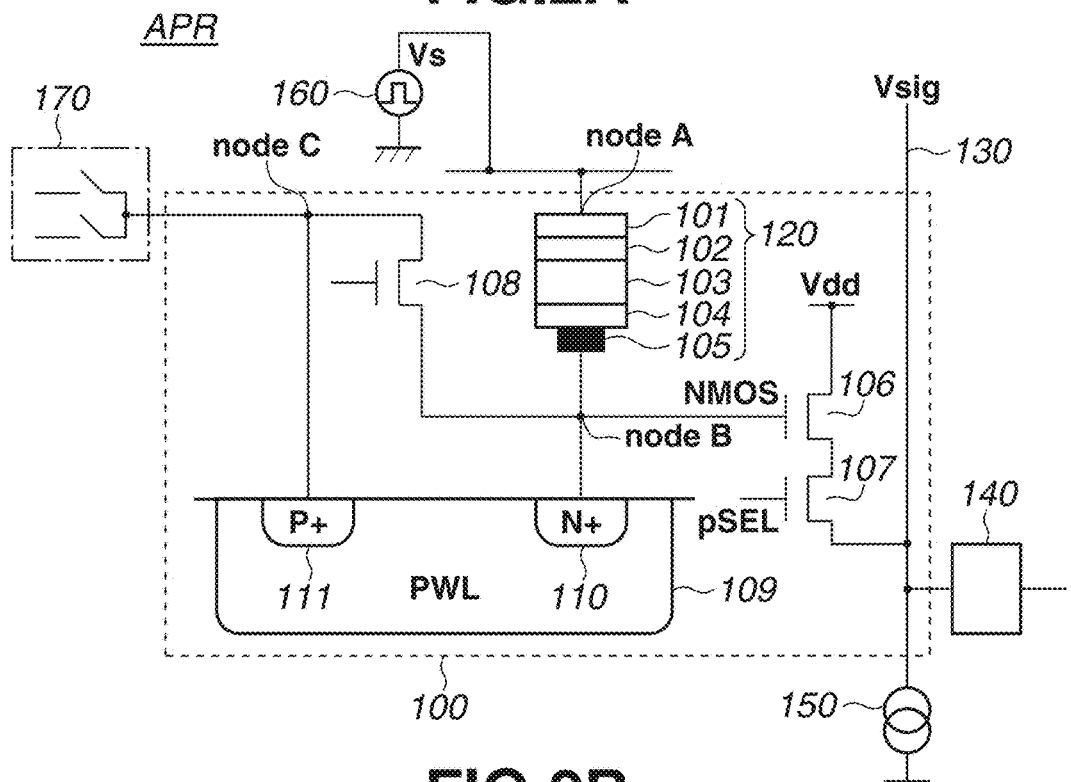
FIGS. 2A and 2B are schematic diagrams illustrating a semiconductor apparatus.
Figure 3A:
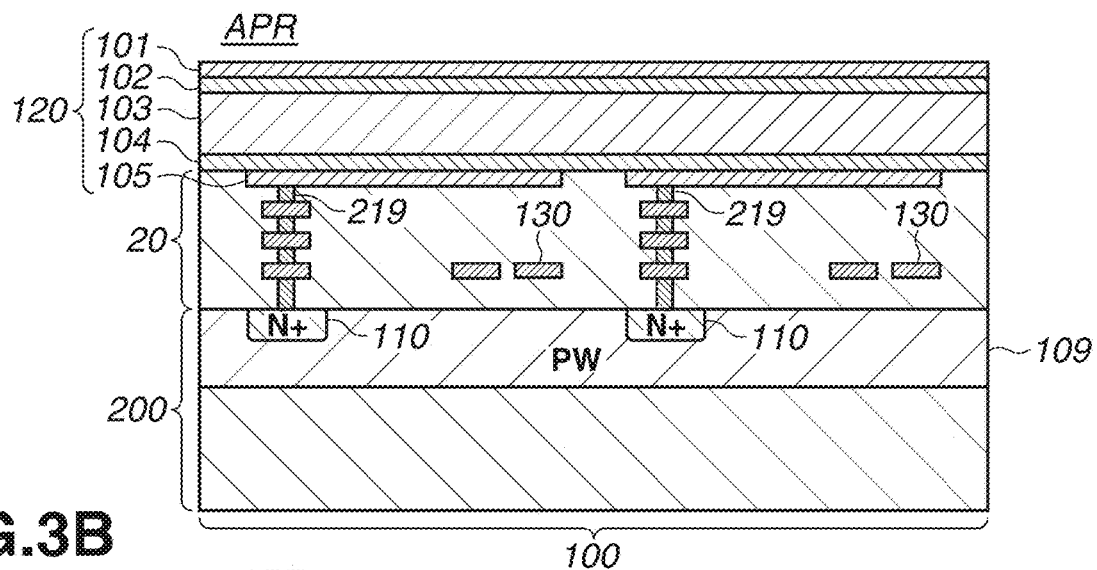
FIGS. 3A, 3B, and 3C are schematic diagrams illustrating a semiconductor apparatus.
Figure 3B:
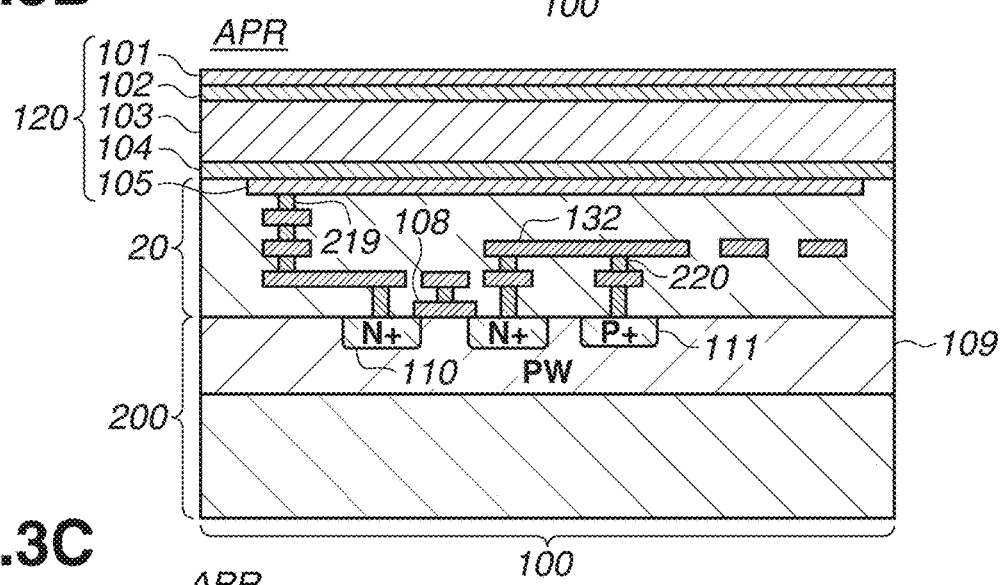

The pixel 100 is described in detail with reference to FIG. 2A. FIG. 2A illustrates an equivalent circuit of the pixel 100 of the semiconductor apparatus APR. FIGS. 3A and 3B schematically illustrate a cross-sectional structure of the pixel 100 of the semiconductor apparatus APR. The semiconductor apparatus APR according to the present exemplary embodiment includes a semiconductor substrate 200 and a photoelectric conversion layer 103 stacked on the semiconductor substrate 200. The semiconductor substrate 200 is provided with a circuit unit configured to receive a signal based on signal charge generated by the photoelectric conversion layer 103. In some exemplary embodiments, the semiconductor apparatus APR includes the plurality of pixels 100. In these exemplary embodiments, the plurality of circuit units corresponding to the plurality of pixels 100 is provided. Each of the plurality of circuit units may include an amplifier configured to amplify a signal.

In FIGS. 3A and 3B, the common electrode 101 is provided above the semiconductor substrate 200. A pixel electrode 105 is provided between the common electrode 101 and the semiconductor substrate 200. A blocking layer 102, the photoelectric conversion layer 103, and a blocking layer 104 are provided between the common electrode 101 and the pixel electrode 105. The blocking layer 102 is an injection blocking layer configured to block signal charge injection, and the blocking layer 104 is an injection blocking layer configured to block injection of charge having a polarity different from the polarity of the signal charge. While the signal charge is based on holes in the present exemplary embodiment, the signal charge can be based on electrons, and even in this case, a similar benefit can be obtained by making each bias setting corresponding to electrons.

FIG. 2A schematically illustrates a structure of the pixel 100 of the semiconductor apparatus APR according to the present exemplary embodiment. The pixel 100 includes the photoelectric conversion portion 120, the amplification transistor 106, the selection transistor 107, and the reset transistor 108. The photoelectric conversion portion 120 includes the common electrode 101, the first blocking layer 102, the photoelectric conversion layer 103, the second blocking layer 104, and the pixel electrode 105. While FIG. 2A illustrates only one pixel 100, the semiconductor apparatus APR according to the present exemplary embodiment includes the plurality of pixels 100.

The pixel electrode 105 is connected to a floating diffusion region 110 in the semiconductor substrate 200 via the node B. A potential based on charge generated by photoelectric conversion appears at the pixel electrode 105, the node B, and the floating diffusion region 110. The potential that appears at the pixel electrode 105, the node B, and the floating diffusion region 110 is the potential to be detected. The amplification transistor 106 reads the potential to be detected as a signal, so that light is detected. The floating diffusion region 110 can also be referred to as a floating diffusion, and a circuit of a combination of the floating diffusion region 110 and the amplification transistor 106 can be referred to as a floating diffusion amplifier. The floating diffusion region 110 is a first conductive-type (negative-type (N-type)) semiconductor region (first semiconductor region). The floating diffusion region 110 is formed in a well region 109. The well region 109 is a second conductive-type (positive-type (P-type)) semiconductor region (second semiconductor region) that is different in polarity from the first conductive-type semiconductor region. The well region 109 is provided commonly across the entire pixel region. The floating diffusion region 110 and the well region 109 form a p-n junction, and the diode 119 (refer to FIG. 1A) having a predetermined capacitance is formed. The well region 109 in the present exemplary embodiment is a P-type well region, so that the well region 109 is denoted by PWL in FIG. 2A. The floating diffusion region 110 has an impurity concentration that is high enough to form a diode structure (p-n junction structure) together with the well region 109, so that the floating diffusion region 110 is described as an N+ type floating diffusion region.

The row driving circuit 201 includes the potential supplier 170 connected to the well region 109. The potential supplier 170 is connected to a contact region 111 in the semiconductor substrate 200 and a drain of the reset transistor 108 via the node C. The potential supplier 170 is connected to the well region 109 via the potential supply line (Vres line) 132, which is a conductive member, as described above.

Further, the potential supply line 132 is connected to the well region 109 via the contact region 111. The contact region 111 is of the second conductive-type (P-type), which is the same as the well region 109, and is a P+ type semiconductor region (third semiconductor region) having an impurity concentration higher than the impurity concentration of the well region 109. The contact region 111 is formed in the well region 109. A reset potential Vres of the well region 109 is controlled via the contact region 111. The potential of the floating diffusion region 110 is controlled via the reset transistor 108. The contact region 111 is provided in order to reduce the contact resistance between the conductive member and the semiconductor substrate 200, and if the contact resistance is low enough without the contact region 111, the contact region 111 can be omitted. In the first exemplary embodiment, the potential supplier 170 is connected to the contact region 111 and the drain of the reset transistor 108, and the potentials of the well region 109 and the floating diffusion region 110 are controlled by the potential supplier 170.

The photoelectric conversion portion 120 forms a photodiode including the terminals that are respectively connected to the nodes A and B in FIG. 2A. In the present exemplary embodiment, the signal charge is based on holes, so that the node A is a cathode of the photodiode and the node B is an anode of the photodiode. A driving voltage Vs as a bias voltage is applied to the node A via a potential supplier 160.

The node B is connected to a gate of the amplification transistor 106. Thus, the floating diffusion region 110 is connected to the gate of the amplification transistor 106. The node B is connected to a source of the reset transistor 108. The gate of the amplification transistor 106 is an input node of an amplifier. With this structure, the signal from the photoelectric conversion portion 120 can be amplified by the amplifier.

While the node B is connected to the source of the reset transistor 108 since the example of detecting holes as the signal charge is based on holes described in the present exemplary embodiment, the node B is connected to the drain of the reset transistor 108 in the case of detecting electrons as the signal charge. In other words, one of the source and drain of the reset transistor 108 is connected to the floating diffusion region 110. Then, the other one of the source and the drain of the reset transistor 108 are to be connected to the well region 109.

A drain of the amplification transistor 106 is connected to the node to which a power source voltage Vdd (e.g., 3.3 V) is supplied. A source of the amplification transistor 106 is connected to the output signal line 130 via the selection transistor 107. A current source 150 is connected to the output signal line 130. The amplification transistor 106 and the current source 150 form a source follower circuit and output a signal from the photoelectric conversion portion 120 to the output signal line 130. The column circuit 140 is further connected to the output signal line 130. A signal from the pixel 100 that is output to the output signal line 130 is input to the column circuit 140. The common electrode 101 is connected to the potential supplier 160 via the node A. The potential supplier 160 supplies the driving voltage Vs as the bias voltage to the common electrode 101.

The present exemplary embodiment is characterized in that the potential supplier 170 is connected to the contact region 111 and the drain of the reset transistor 108, and controls the potentials of the well region 109 and the floating diffusion region 110, as described above. The reset transistor 108 is turned on to short-circuit the well region 109 and the floating diffusion region 110 so that the potentials of the well region 109 and the floating diffusion region 110 become substantially equal, i.e., the zero bias resetting is executed. The potential is supplied from one power source (the potential supplier 170) to the well region 109 and the floating diffusion region 110 so that variations in dark current in each pixel due to the zero bias resetting are reduced.

Next, the planar and cross-sectional structures of the semiconductor apparatus APR in the present exemplary embodiment will be described.

Figure 2B:
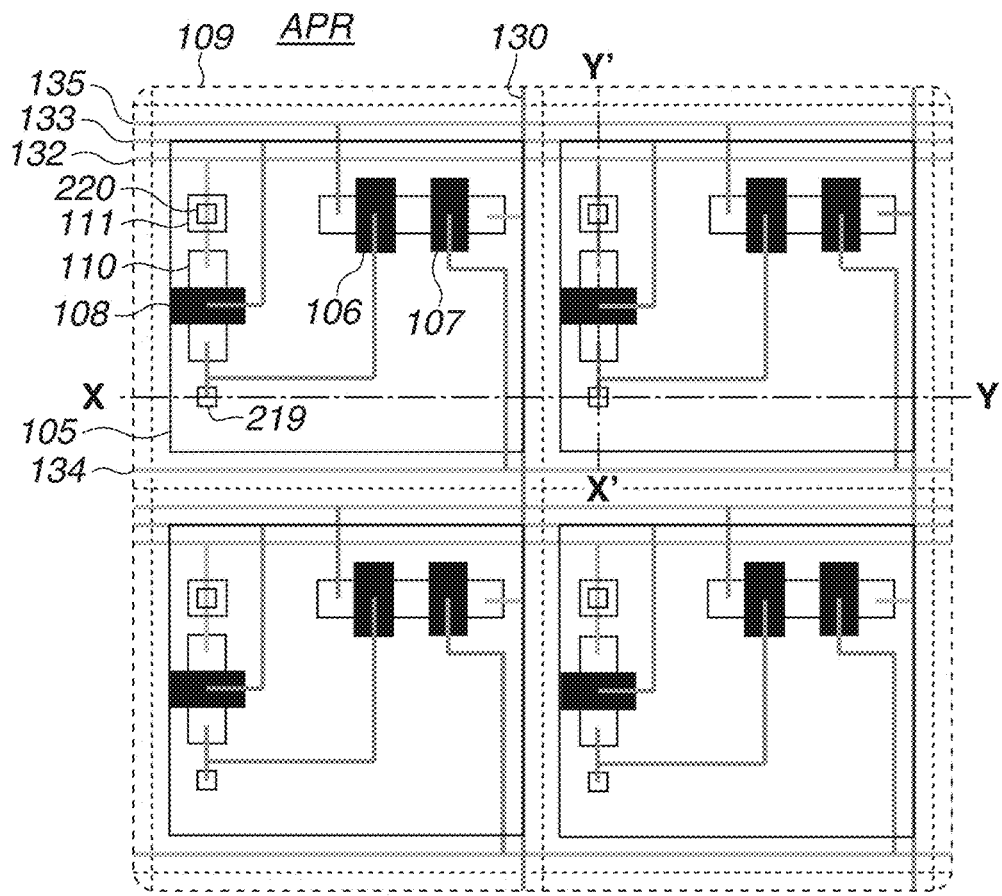

FIG. 2B schematically illustrates the planar structure of four pixels 100 arranged in an array of two rows and two columns. The other pixels have a similar planar structure. In FIG. 2B, the photoelectric conversion layer 103 stacked above the pixel electrode 105 is not illustrated.

Figure 6A:
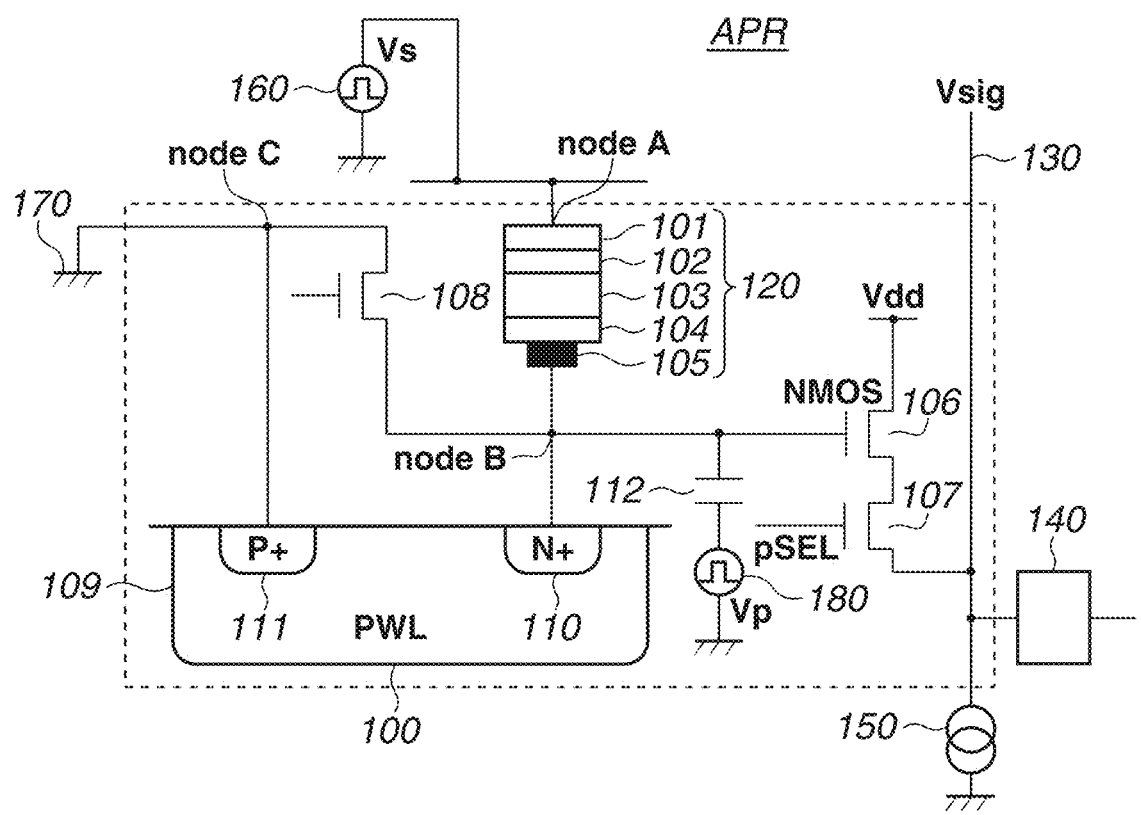

FIGS. 3A and 3B schematically illustrate a cross-sectional structure of the semiconductor apparatus APR along an X-Y dot-dash line in FIG. 2B. Further, FIGS. 6A and 6B schematically illustrate a cross-sectional structure of the pixel 100 of the semiconductor apparatus APR along an X'-Y' dashed-dotted line in FIG. 2B. Portion having similar functions to those in FIG. 2A are given the same reference numerals. The reference numeral of a transistor is given to the corresponding gate. In FIGS. 3A, 3B, and 6A, the photoelectric conversion layer 103 stacked above the pixel electrode 105 is also displayed.

The pixel structure is described below with reference to FIGS. 2B, 3A, and 3B. The semiconductor apparatus APR includes the semiconductor substrate 200. The semiconductor substrate 200 is provided with the well region 109, which is a P-type semiconductor region. Since the well region 109 in the present exemplary embodiment is a P-type semiconductor region, the well region 109 is denoted by PW in FIG. 2A. In the present exemplary embodiment, the well region 109 is provided commonly across the entire pixel region. The floating diffusion region 110, which is an N-type semiconductor region and includes a source and drain of a pixel transistor, is provided in the well region 109. The pixel transistor includes, for example, the amplification transistor 106, the selection transistor 107, and is an N-channel metal-oxide-semiconductor (NMOS) transistor. Further, the contact region 111, which is a P-type semiconductor region and forms a contact to supply a voltage to the well region 109, is provided in the well region 109. Further, a plurality of wiring layers 202 including a gate of the pixel transistor and the conductive member forming the wiring lines is provided on or above the semiconductor substrate 200.

The common electrode 101 is provided above the semiconductor substrate 200. The pixel electrode 105 is provided between the common electrode 101 and the semiconductor substrate 200. The pixel electrode 105 is connected to the gate of the amplification transistor 106 via a connection portion 219. Further, the photoelectric conversion layer 103 is provided between the common electrode 101 and the pixel electrode 105. The first blocking layer 102 is provided between the common electrode 101 and the photoelectric conversion layer 103. The second blocking layer 104 is provided between the photoelectric conversion layer 103 and the pixel electrode 105. The first blocking layer 102 has the function of blocking hole injection from the common electrode 101 into the photoelectric conversion layer 103 when the photoelectric conversion portion 120 is in a reverse biased state. The second blocking layer 104 has the function of blocking electron injection from the pixel electrode 105 into the photoelectric conversion layer 103. In this way, dark current is reduced.

As illustrated in FIGS. 2A, 3A, and 3B, the photoelectric conversion portion 120 of each pixel 100 includes at least the common electrode 101, the blocking layer 102, the photoelectric conversion layer 103, the second blocking layer 104, and the pixel electrode 105.

The common electrodes 101 are electrically insulated row by row as illustrated in FIG. 1A. Meanwhile, as illustrated in FIGS. 3A and 3B, the common electrodes 101 of the plurality of pixels 100 included in one row are formed by a common conductive member. Further, the pixel electrode 105 of each pixel 100 is electrically insulated from the pixel electrodes 105 of the other pixels 100. More specifically, the plurality of pixel electrodes 105 is separately provided to each of the plurality of pixels 100. While the power source voltage Vdd is supplied from a dedicated power source line 135 to the pixels 100 of each row in the present exemplary embodiment, the power source voltage Vdd may be supplied as an equivalent voltage as the driving voltage Vs from a common electrode power source. In this case, the dedicated power source line 135 of the power source voltage Vdd can be omitted, so that the area of the pixels 100 is further reduced. To this end, the voltage values of the power source voltage Vdd and an electrode voltage (the driving voltage Vs) can be set to a common voltage value in a case in which the signal charge is based on holes and the pixel transistor is a NMOS transistor and the common electrode power source (the driving voltage Vs; not illustrated) is fixed. Examples of the case where the power source is fixed to a voltage equivalent to the driving voltage Vs include a case in which only a rolling shutter operation is conducted while a global shutter operation is not conducted, as described below.

The potential supply line (Vres line) 132 is connected to the contact region 111 and the drain of the reset transistor 108. A potential Vres is supplied to the well region 109 via the contact region 111. In other words, the potential of the well region 109 is controlled by the potential supply line 132. With this structure, the potential supply line 132 is able to control the potentials of the well region 109 and the floating diffusion region 110.

Now, the specific structure of the photoelectric conversion portion 120 is described in detail. The common electrode 101 of the photoelectric conversion portion 120 is formed of a conductive member having a high light transmittance. For example, a compound containing indium or tin such as indium tin oxide (ITO), or a compound such as zinc oxide (ZnO) is used as a material of the common electrode 101. This structure enables a large amount of light to enter the photoelectric conversion layer 103. Thus, the sensitivity is improved. Alternatively, polysilicon or metal that is thin enough to transmit a predetermined amount of light may be used as the common electrode 101. Since the resistance of metal is low, embodiments in which metal is used as a material of the common electrode 101 is beneficial for reducing power consumption or increasing speed.

The first blocking layer 102 is provided between the common electrode 101 and the photoelectric conversion layer 103. For the first blocking layer 102, an N- or P-type semiconductor that is of the same type as the semiconductor used in the photoelectric conversion layer 103 and has a higher impurity concentration than the impurity concentration of the semiconductor used in the photoelectric conversion layer 103 can be used. For example, in the cases in which an amorphous silicon (a-Si) is used in the photoelectric conversion layer 103, a-Si having a relatively high impurity concentration is used for the first blocking layer 102. Since the position of the Fermi level differs depending on the difference in impurity concentration, a potential barrier is formed for only either of electrons and holes, to prevent charge injection from the electrode. The structure is such that charge having a different polarity from the polarity of the signal charge is based on holes promptly injected. In the present exemplary embodiment, the signal charge is based on holes, so that an N-type blocking layer is used in the first blocking layer 102 to block hole injection. Alternatively, the first blocking layer 102 can be formed using a material that is different from the photoelectric conversion layer 103. In this structure, a heterojunction is formed. Since the bandgap differs depending on the material difference, a potential barrier can be formed only with respect to one of electrons and holes.

The photoelectric conversion layer 103 photoelectrically converts light incident on the photoelectric conversion layer 103. At least part of the photoelectric conversion layer 103 is to have the photoelectric conversion function described above. The photoelectric conversion layer 103 is formed using a semiconductor material such as an intrinsic a-Si or a-Si having a relatively low impurity concentration. Alternatively, the photoelectric conversion layer 103 may be formed using a compound semiconductor material. Examples thereof include a III-V compound semiconductor (e.g., BN, GaAs, GaP, AlSb, or GaAlAsP), a II-VI compound semiconductor (e.g., CdSe, ZnS, or HdTe), and a IV-VI compound semiconductor (e.g., PbS, PbTe, or CuO). Alternatively, the photoelectric conversion layer 103 may be formed using an organic semiconductor material. For example, fullerene, coumarin 6 (C6), Rhodamine 6G (R6G), zinc phthalocyanine (ZnPc), or quinacridon, a phthalocyanine-based compound, or a naphthalocyanine-based compound can be used. Further, a layer containing quantum dots formed using any of the above-described semiconductor materials can be used in the photoelectric conversion layer 103. The quantum dot is a particle having a diameter of 20.0 nm or less.

In the case in which the photoelectric conversion layer 103 is formed using a semiconductor material, the semiconductor material may has a low impurity concentration or is an intrinsic semiconductor material. With this structure, a depletion layer can be sufficiently extended in the photoelectric conversion layer 103 and thus benefits such as increased sensitivity and reduced noise are obtained.

The second blocking layer 104 is provided between the photoelectric conversion layer 103 and the pixel electrode 105. For the second blocking layer 104, a semiconductor that is of the same type as the semiconductor used in the photoelectric conversion layer 103 and has a higher impurity concentration than the impurity concentration of the semiconductor used in the photoelectric conversion layer 103 can be used. For example, in a case in which a-Si is used in the photoelectric conversion layer 103, a-Si having a high impurity concentration is used in the first blocking layer 102. Since the position of the Fermi level differs depending on the difference in impurity concentration, a potential barrier is formed only for either of electrons and holes, to prevent charge injection from the electrode. In the present exemplary embodiment, the signal charge is based on holes, so that the second blocking layer 104 is a P-type layer in order to block injection of electrons having the opposite polarity to the polarity of a hole.

A semiconductor material of the blocking layers 102 and 104 can be selected from inorganic semiconductor materials, such as silicon, germanium, and gallium arsenide, and organic semiconductor materials. The semiconductor material that forms the photoelectric conversion layer 103 may be different from the semiconductor material that forms the blocking layers 102 and 104. Alternatively, the bandgap of the semiconductor material that forms the accumulation layer may be different from the bandgaps of the semiconductor materials that form the blocking layers 102 and 104. The bandgap is the difference between the bottom energy level of the conduction band and the top energy level of the valence band. The materials that form the blocking layers 102 and 104 are not limited to a semiconductor material.

The photoelectric conversion layer 103 consisting of a single layer may include first and second portions having different properties from each other. With this structure, the first and second portions respectively function as the photoelectric conversion layer 103 and the blocking layer. For example, in an embodiment in which the photoelectric conversion layer 103 is formed using a semiconductor material, a semiconductor material that has different impurity concentrations of the first and second portions, may be used.

Alternatively, the blocking layers 102 and 104 can be formed using a material that is different from the material of the photoelectric conversion layer 103. In this structure, a heterojunction is formed. Since the bandgap differs due to the material difference, a potential barrier can be formed only for either of electrons and holes.

The first blocking layer 102 and the second blocking layer 104 are formed so that the photoelectric conversion portion 120 has a diode characteristic. In other words, in a case in which an N-type semiconductor is used in the first blocking layer 102, a P-type semiconductor is used in the second blocking layer. At this time, the signal charge is based on holes based on holes.

The pixel electrode 105 is formed using a conductive member such as metal. For the pixel electrode 105, the same material as the material of the conductive member forming the wiring lines or the material of a conductive member forming a pad electrode for connecting to an external apparatus is used. With this structure, the pixel electrode 105 and the conductive member forming the wiring line can be formed simultaneously, or the pixel electrode 105 and the pad electrode can be formed simultaneously. Thus, the manufacturing process can be simplified.

Figure 3C:
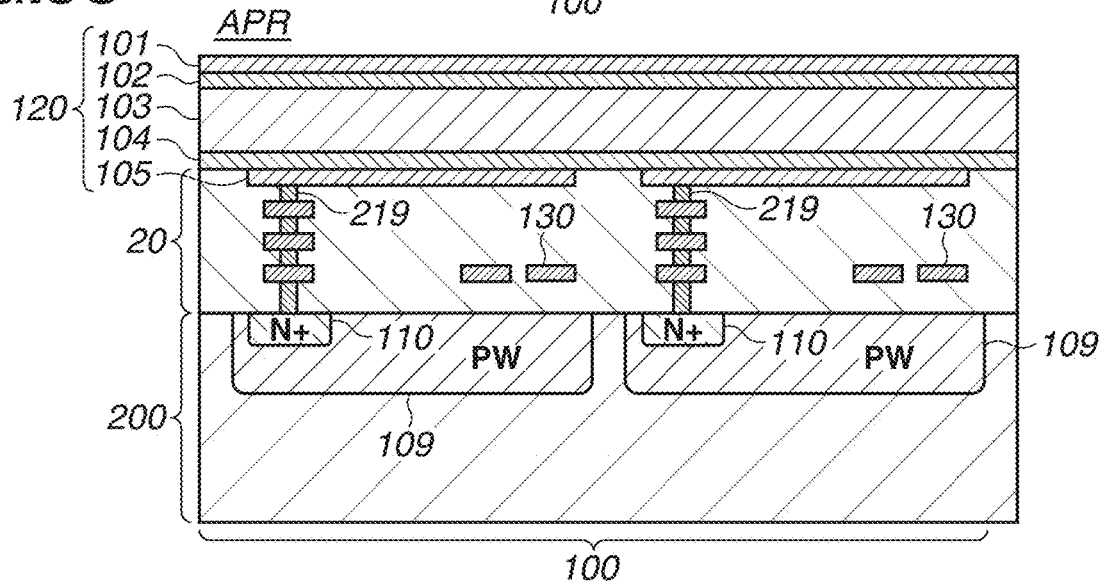

FIG. 3C illustrates a modification example of the well region 109. In the examples illustrated in FIGS. 3A and 3B, the well region 109 is provided commonly across the entire pixel region, so that the examples are suitable for the cases in which the pixel size is small (2.5 μm or less). Further, since the potentials of the well regions 109 of all the pixels 100 can be simultaneously controlled, the global shutter operation described below is executable. On the other hand, in the modification example illustrated in FIG. 3C, the well region 109 is provided across the pixels 100 of each row, so that the modification example is suitable for a case in which the pixel size is large (2.5 μm or more). In this case, when the potential of the well region 109 is controlled, the potential of the well region 109 can be controlled row by row, so that a rolling shutter operation can be executed as well as the global shutter operation described below.

[Description of Function of Photoelectric Conversion Unit and Global Shutter Operation]

Next, the operations of the pixel 100 and the functions of the first blocking layer 102, the photoelectric conversion layer 103, and the second blocking layer 104 in the present exemplary embodiment will be described in detail.

Figure 4A:
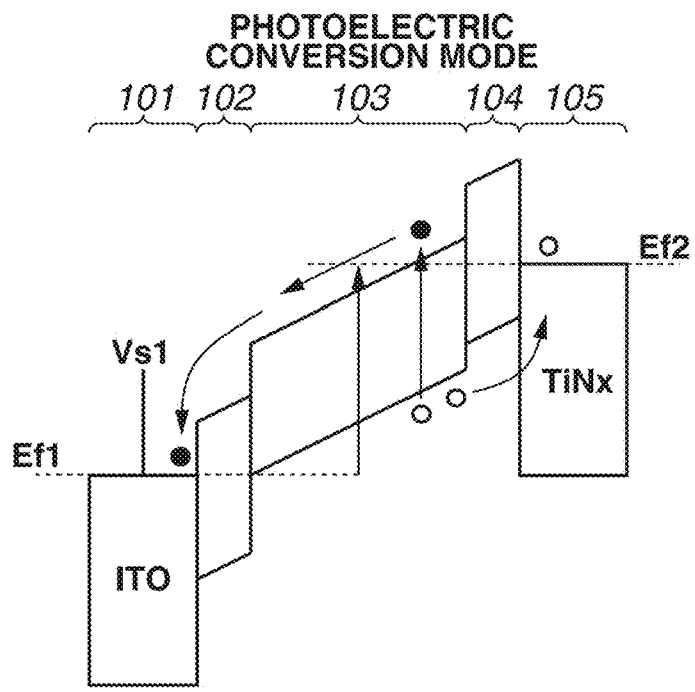
FIGS. 4A, 4B, and 4C are schematic diagrams illustrating a semiconductor apparatus.
Figure 4B:
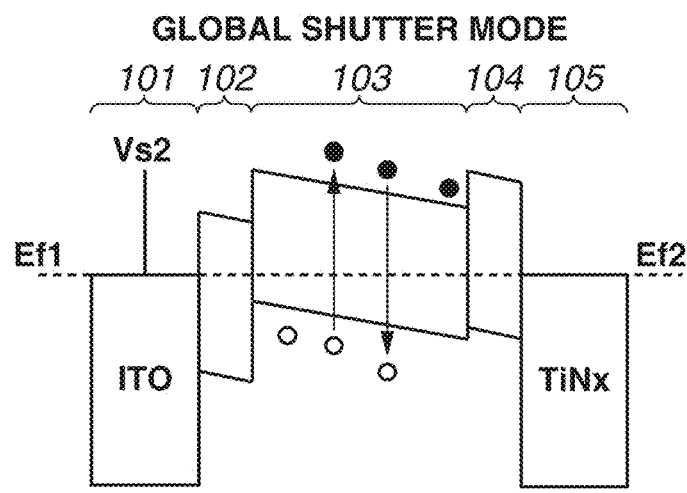

FIGS. 4A and 4B schematically illustrate energy bands of the photoelectric conversion portion 120 and potentials in a case in which the bias voltage is applied. FIG. 4A corresponds to a photoelectric conversion mode (signal charge accumulation mode), whereas FIG. 4B illustrates a global shutter mode.

FIGS. 4A and 4B illustrate the energy bands of the common electrode 101, the first blocking layer 102, the photoelectric conversion layer 103, the second blocking layer 104, and the pixel electrode 105. In the present exemplary embodiment, the first blocking layer 102 blocks hole injection from the common electrode 101 into the photoelectric conversion layer 103. Further, the second blocking layer 104 blocks electron injection from the pixel electrode 105 into the photoelectric conversion layer 103.

In FIGS. 4A and 4B, the first blocking layer 102, the photoelectric conversion layer 103, and the second blocking layer 104 form a homojunction. In other words, the first blocking layer 102, the photoelectric conversion layer 103, and the second blocking layer 104 are formed using the same semiconductor material. In order to realize a blocking characteristic, the impurity concentration of the photoelectric conversion layer 103 is different from the impurity concentrations of the first blocking layer 102 and the second blocking layer 104. For example, the first blocking layer 102 is formed using an N-type semiconductor material, the photoelectric conversion layer 103 is formed using an intrinsic semiconductor, and the second blocking layer 104 is formed using a P-type semiconductor material.

The vertical axes in FIGS. 4A and 4B represent the potential with respect to electrons, and the higher positions on the vertical axes indicate higher potentials with respect to electrons whereas the lower positions on the vertical axes indicate lower potentials with respect to electrons. Fermi levels Ef1 and Ef2 represent the Fermi levels at the respective electrodes. For the first blocking layer 102, the photoelectric conversion layer 103, and the second blocking layer 104, the bandgap between the conduction band and the valence band is represented.

The photoelectric conversion (signal charge accumulation) mode in FIG. 4A illustrates the potential in a state in which the photoelectric conversion portion 120 conducts photoelectric conversion, and the signal charge is based on holes accumulated in the pixel electrode 105. The modes are switched by controlling the driving voltage Vs. The electrons and holes that are generated by photoelectric conversion are indicated by black and white circles, respectively. In the present exemplary embodiment, the signal charge is based on holes. The driving voltage Vs1 (e.g., 3.3 V equal to Vdd) is applied to the common electrode 101 of the photoelectric conversion portion 120, and the photoelectric conversion portion 120 is set to the reverse biased state. At this time, the photoelectric conversion layer 103 is in a depleted state. Among the charges that are photoelectrically converted by the photoelectric conversion layer 103, the holes are drifted to the pixel electrode 105 by the bias voltage and accumulated as signal charge during a desired accumulation period, and the potential of the node B is increased corresponding to the amount of accumulated signal charge. Since the photoelectric conversion portion 120 is in the reverse biased state and the first blocking layer 102 blocks injection of the holes from the common electrode 101 into the photoelectric conversion layer 103, generation of dark current is prevented. As the charge accumulation proceeds, the photoelectric conversion layer 103 is changed toward a flat band state.

Meanwhile, the electrons generated by the photoelectric conversion layer 103 are drifted toward the common electrode 101 by the bias voltage and are discharged to the outside of the photoelectric conversion portion 120, and thus the electrons do not contribute to the signals. Since the second blocking layer 104 blocks injection of the electrons from the pixel electrode 105 into the photoelectric conversion layer 103, the signal charge accumulated in the photoelectric conversion layer 103 is not likely to leak.

In the global shutter mode in FIG. 4B, the bias is applied so that the potential of the photoelectric conversion portion 120 becomes substantially flat. At this time, a driving voltage Vs2 (e.g., 1.5 V equal to the reset voltage Vres) is applied to the common electrode 101. Since the holes are accumulated, there is a relationship of Vs2<Vs1. In a state close to the flat band, there is almost no electron injection from the common electrode 101 and, furthermore, the bias applied to the photoelectric conversion layer 103 is small. Thus, the injected electrons are not likely to recombine with the signal charge holes accumulated in the pixel electrode 105 (node B) and leak, and the signal charge holes that are photo-produced by the photoelectric conversion layer 103 are not likely to be accumulated in the pixel electrode 105. The photoelectric conversion portion 120 is changed to a dead state and becomes capable of holding signal charge accumulated in the node B of the pixel electrode 105 even during light irradiation. Execution of operations of the present exemplary embodiment enables a simultaneous start of signal accumulation (global reset) and simultaneous end of signal accumulation (global shutter) across all the pixels 100, and thus a so-called global shutter operation is realized. It should be noted, however, that since the pixel circuit illustrated in FIG. 2A is used in the present exemplary embodiment, the signal charge by photoelectric conversion cannot be accumulated in the node B during the signal reading of the node B. If, however, a memory configured to hold the signal charge is included, the signal charge by photoelectric conversion can be accumulated in the node B even during the signal reading of the node B.

[Description of Zero Bias Resetting]

Figure 4C:
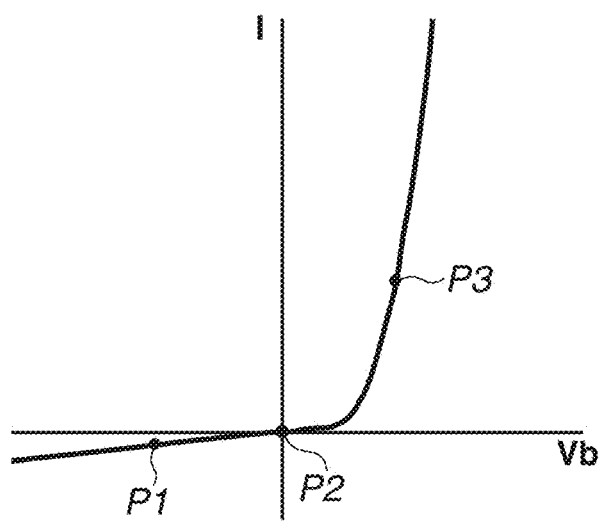

The zero bias resetting in the present exemplary embodiment will be described with reference to the drawings. FIG. 4C is a schematic diagram illustrating an IV characteristic of the floating diffusion region 110 connected to the pixel electrode 105 in dark period. The floating diffusion region 110 and the well region 109 form a diode. The vertical axis denotes current that flows in the diode, and the horizontal axis denotes a bias voltage Vb that is applied to the diode.

In FIG. 4C, points P1, P2, and P3 respectively indicate a reverse biased state, zero biased state, and forward biased state. The diode 119 is set to the reverse biased state of the point P1 in order to electrically separate the P- and N-type semiconductor regions. However, a defect often occurs at the p-n junction, and a leak current flows through the defect. The leak current depends on the reverse bias voltage applied between the P- and N-type semiconductor regions, so that the amount of leak current at the point P1 is large. In FIG. 4C, a component originating from the leak current is also included in the illustration. The leak current becomes dark current during the photoelectric conversion (during signal accumulation) and deteriorates the signal/noise (S/N) ratio.

The period during which the leak current is most likely to be an issue is the time immediately after the pixel 100 is reset, which is the period of a start of signal accumulation. Thus, in order to minimize the influence of leak current, the bias state is set to the point P2 so that the bias voltage Vb between the N+ type semiconductor region (floating diffusion region 110) and the P-type semiconductor region (well region 109) becomes 0 V. This is referred to as "zero bias resetting" or "zero bias driving".

[Description of Semi-Global Shutter Operation]

Figure 5A:
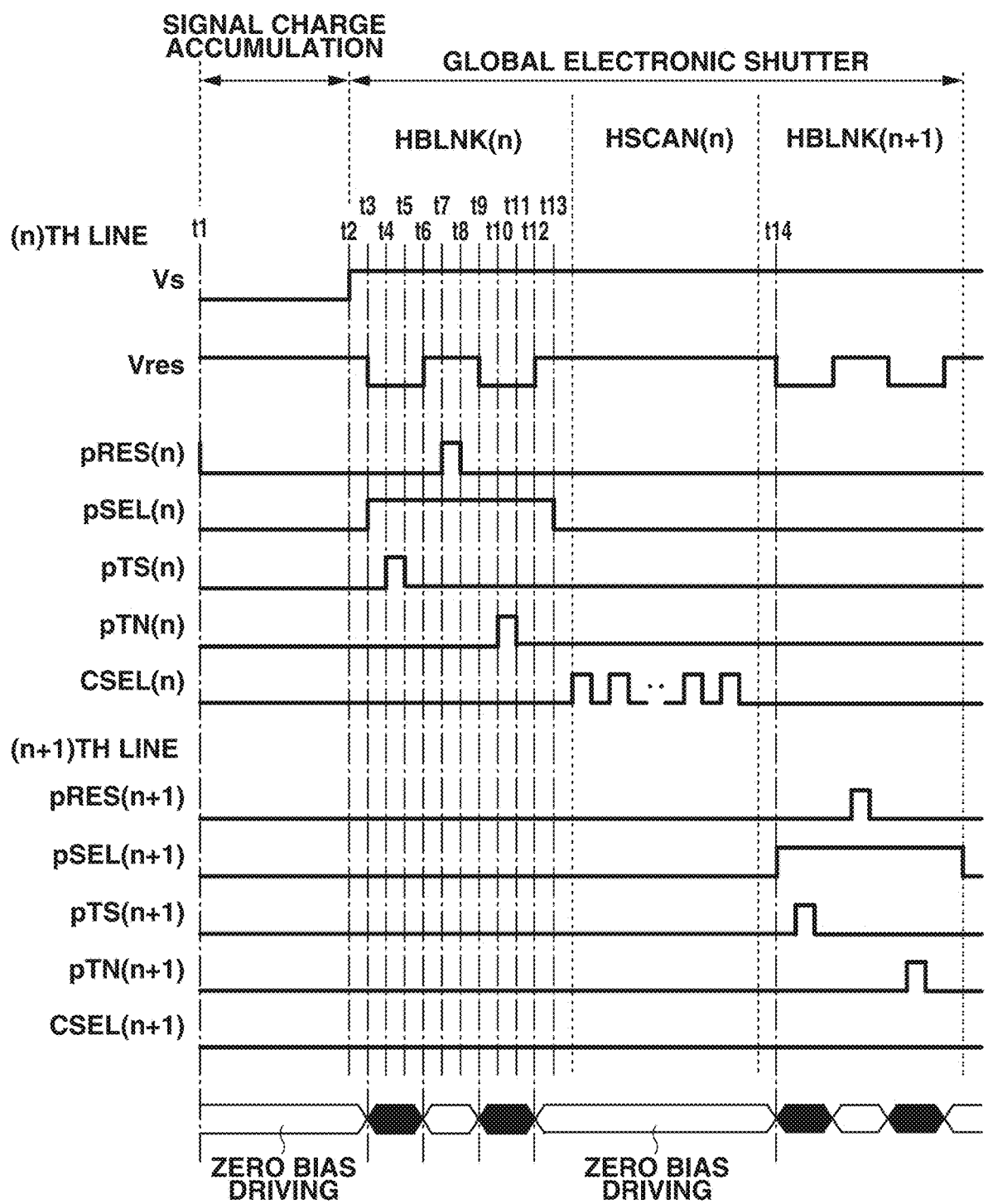
FIGS. 5A and 5B are schematic diagrams illustrating a semiconductor apparatus.

Next, a method of driving the semiconductor apparatus APR in the present exemplary embodiment will be described. FIG. 5A illustrates a timing chart of a driving signal used in the semiconductor apparatus APR in the present exemplary embodiment. For simplification, the driving signals corresponding to the signal reading operations of the nth and (n+1)th rows are illustrated in FIG. 5A.

The row selection signal pSEL is supplied to the gate of the selection transistor 107. The voltage of the potential supply line Vres is supplied to the drain of the reset transistor 108 and the well region 109. The reset signal pRES is supplied to the gate of the reset transistor 108. The driving signal pTS is supplied to the S/H switch 303. The driving signal pTN is supplied to the S/H switch 305. The driving signal CSEL is supplied to the column circuit 140.

When the row selection signal pSEL, the reset signal pRES, the driving signal pTS, and the driving signal pTN are at a high level, the corresponding transistor or switch is turned on. When the row selection signal pSEL, the reset signal pRES, the driving signal pTS, and the driving signal pTN are at a low level, the corresponding transistor or switch is turned off.

During the period (time point t7 to t8) when the reset transistor 108 is on, the potential supplier 170 supplies a high-level potential. During the periods (time point t3 to t6 and t9 to t12) when the reset transistor 108 is off, the potential supplier 170 supplies a low-level potential.

In the semi-global shutter operation, the potential supply lines Vres of all the rows are simultaneously controlled.

From a time point t1 to a time point t2, a voltage Vs1 (e.g., 3.3 V) is applied to the common electrode 101 of each row so that the photoelectric conversion portion 120 is changed to the photoelectric conversion mode region illustrated in FIG. 4A. Further, at the same time, the potential supply line Vres is changed to a high level (e.g., 1.5 V), and the zero bias resetting is executed. Meanwhile, photoelectric conversion is simultaneously conducted with respect to all the pixels 100, and optical signal charges are accumulated in the pixel electrodes 105 (simultaneous exposure).

At the time point t2, the voltage Vs2 (e.g., 1.5 V) is applied to the common electrode 101 of each of the rows so that the photoelectric conversion portion 120 is changed to the global shutter mode. At this time, the sensitivities of the photoelectric conversion portions 120 of all the pixels 100 become zero simultaneously.

At the time point t3, the potential supply line Vres is changed to a low level (e.g., 0 V), and the pixel transistor becomes operable. In the present exemplary embodiment, the well region 109 is provided commonly across the entire pixel region, and all pixel transistors are formed in the well region 109. The well region 109 works also as a back gate of the pixel transistor, so that in a case of operating the pixel transistor, the reset voltage Vres is to be set to a low level (e.g., 0 V). At this time, the state is no longer the zero bias resetting state. Further, at the same time, a driving signal pSEL(n) is changed to a high level, and the selection transistor 107 of the pixel 100 of the (n)th row is turned on. Consequently, the amplification transistor 106 of the pixel 100 of the (n)th row outputs a signal.

At the time point t4, the driving signal pTS(n) is changed to a high level, and at the time point t5, the driving signal pTS(n) is changed to a low level. With this operation, the signal S containing the optical signal accumulated in the node B and a threshold value variation of the amplification transistor 106 is held in the capacitor CTS of the column circuit 140.

At the time point t6, the potential supply line Vres is changed to a high level (e.g., 1.5 V). At this time, the zero bias resetting is executed again.

At the time point t7, a driving signal pRes(n) is changed to a high level, and the reset transistor 108 of the pixel 100 of the (n)th row is turned on. With this operation, the bias is reset to the reset voltage Vres of the potential supply line Vres of the node B of the pixel 100 of the (n)th row. Then, at the time point t8, a driving signal pRES(n) is changed to a low level, and the reset transistor 108 is turned off.

At the time point t9, the potential supply line Vres is changed to a low level (e.g., 0 V), and the pixel transistor becomes operable. At this time, the state is no longer the zero bias resetting state.

Then, at the time point t10, the driving signal pTN(n) is changed to a high level, and at the time point t11, the driving signal pTN(n) is changed to a low level. With this operation, a signal N containing a threshold value variation of the amplification transistor 106 is held in the capacitor CTN of the column circuit 140.

At the time point t12, the potential supply line Vres is changed to a high level (e.g., 1.5 V), and the zero bias resetting is executed.

At a time point t13, a driving signal pSEL(n) is changed to a low level, and the signal reading from the pixel 100 of the (n)th row to the column circuit 140 is finished.

The noise signal N and the optical signal S read by the column circuit 140 are output column by column to the amplification unit 203 based on the driving signal CSEL. The amplification unit 203 outputs the difference between the signals S and N to the ADC unit 204.

At a time point t14, a driving signal pSEL(n+1) is changed to a high level, and the selection transistor 107 of the pixel 100 of the (n+1)th row is turned on. Thereafter, the signal reading from the pixel 100 of the (n+1)th row is conducted. This operation is similar to that during the period from the time point t2 to the time point t13, so that description thereof is omitted.

During the signal reading of each row, the voltage Vs2 is applied to the common electrode 101 of each of the rows, and the state is set to a shutter state.

Similarly, the signal reading is conducted up to the last row.

Thereafter, the voltage Vs1 (e.g., 3.3 V) is applied to the common electrode 101 of each of the rows so that the photoelectric conversion portion 120 is changed to the photoelectric conversion mode again. During this period, all the pixels 100 are simultaneously set to the photoelectric conversion mode (simultaneous exposure).

In the present exemplary embodiment, the state is not the zero biased state from the time point t3 to the time point t6 and from the time point t9 to the time point t12 during which the potential supply line Vres is a low level, as described above. Thus, dark current is generated during this period. The well region 109 is common to all the pixels 100, and the potential supply line Vres is simultaneously controlled across the entire pixels 100, so that dark current generated in the (n)th row is read as a signal in the (n+1)th row. Similarly, dark current is generated and is read as a signal in the subsequent reading rows. While the semi-global shutter operation is described in the present exemplary embodiment, the global shutter operation is also executable if a memory configured to hold the signal charge is provided.

[Description of Rolling Shutter Operation]

Referring to FIG. 5A, the semi-global shutter operation has been described, but a rolling shutter operation can be executed in a modification example of the present exemplary embodiment in FIG. 3C. The rolling shutter operation will be described below.

Figure 5B:
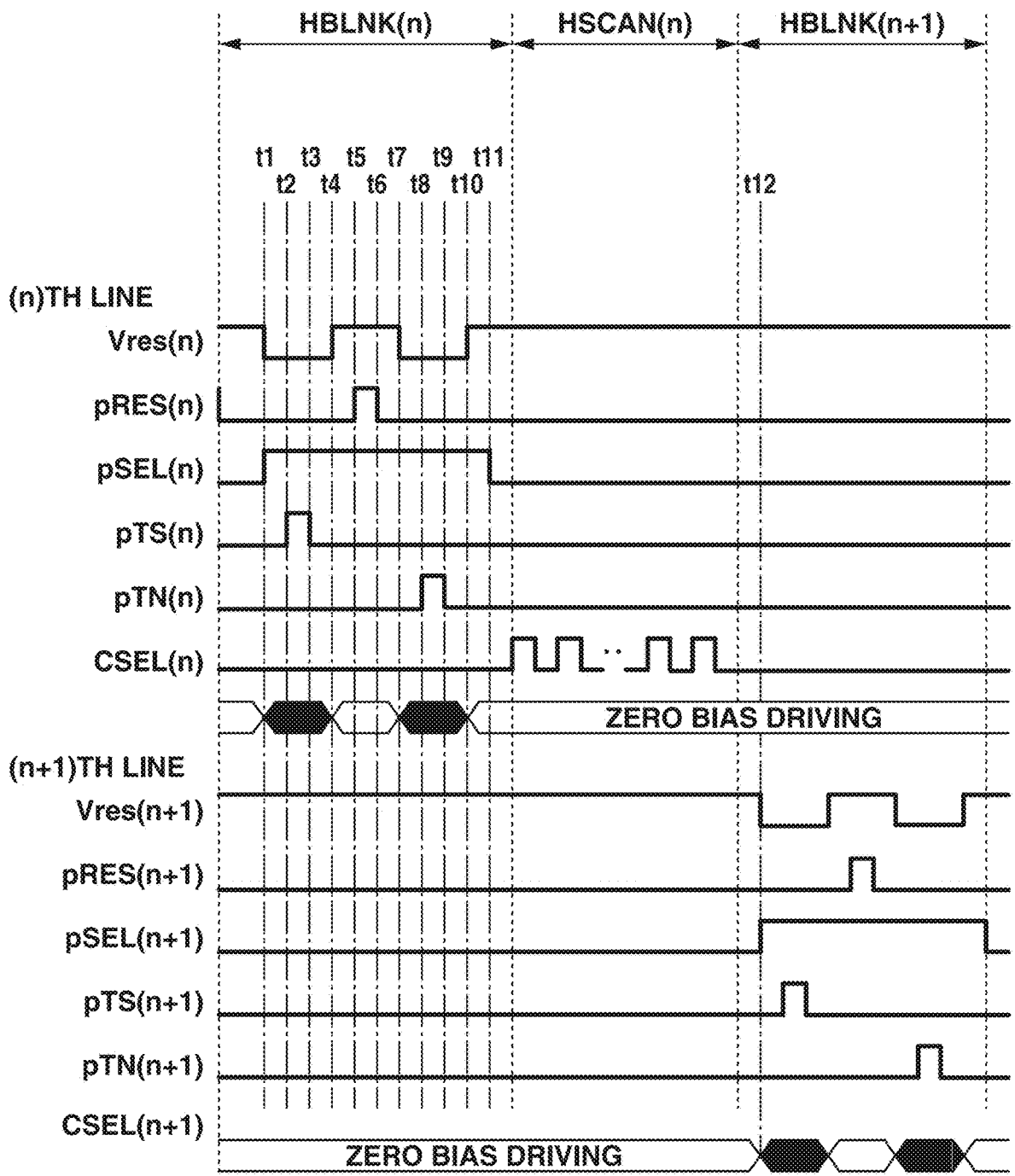

FIG. 5B illustrates a timing chart of a driving signal in the rolling shutter operation that is used in the semiconductor apparatus APR in the present exemplary embodiment. For simplification, the driving signals corresponding to the signal reading operation of two rows, the nth and (n+1)th rows, are illustrated in FIG. 5B.

The driving voltage Vs (not illustrated) is supplied to the node A of the photoelectric conversion portion 120. In the rolling shutter operation, the driving voltage Vs is set to a fixed value (3.3 V equal to Vdd) so that the photoelectric conversion portion 120 is constantly set to the photoelectric conversion mode in a weak biased state.

Before the time point t1, the photoelectric conversion portions 120 of the pixels 100 of the nth and (n+1)th rows are in the signal charge accumulation state. Further, at the same time, the potential supply lines Vres(n) and (n+1) are at a high level (e.g., 1.5 V), and the state is the zero bias resetting state.

At the time point t1, the potential supply line Vres(n) is changed to a low level (e.g., 0 V), and the pixel transistor becomes operable. At this time, the state is no longer the zero bias resetting state. Further, at the same time, the row selection signal pSEL(n) is changed to a high level, and the selection transistor 107 of the pixel 100 of the (n)th row is turned on. With this operation, the amplification transistor 106 of the pixel 100 of the (n)th row outputs a signal.

At the time point t2, the driving signal pTS(n) is changed to a high level, and at the time point t4, the driving signal pTS(n) is changed to a low level. During this time, the signal S containing the optical signal accumulated in the node B and a threshold value variation of the amplification transistor 106 is held in the capacitor CTS of the column circuit 140.

At the time point t4, the potential supply line Vres(n) is changed to a high level (e.g., 1.5 V), and the state is changed to the zero bias resetting state.

At the time point t5, the driving signal pRes(n) is changed to a high level, and the reset transistor 108 of the pixel 100 of the (n)th row is turned on. With this operation, the bias is reset to the reset voltage Vres of the potential supply line Vres(n) of the node B of the pixel 100 of the (n)th row. Thereafter, at the time point t6, the driving signal pRES(n) is changed to a low level, and the reset transistor 108 is turned off.

At the time point t7, the potential supply line Vres(n) is changed to a low level (e.g., 0 V), and the state is no longer the zero bias resetting state.

Thereafter, at the time point t8, the driving signal pTN(n) is promptly changed to a high level, and at the time point t9, the driving signal pTN(n) is changed to a low level. During this time, the signal N containing a threshold value variation of the amplification transistor 106 is held in the capacitor CTN of the column circuit 140. If light enters in a state in which the photoelectric conversion portion 120 is in the photoelectric conversion mode, the light causes a start of charge generation, so that the interval between the time points t8 and t9 is desirably short.

At the time point t10, the potential supply line Vres(n) is changed to a high level (e.g., 1.5 V), and the state is changed to the zero bias resetting state.

Thereafter, the pixel 100 of the (n)th row starts accumulating signal charge of the next frame. The energy band state of the photoelectric conversion portion 120 during the signal charge accumulation is illustrated in FIG. 4A.

At the time point t11, the row selection signal pSEL(n) is changed to a low level, and the signal reading from the pixel 100 of the (n)th row to the column circuit 140 is finished.

The noise signal N and the optical signal S read by the column circuit 140 are output column by column to the amplification unit 203 based on the driving signal CSEL. The amplification unit 203 outputs the difference between the signals S and N to the ADC unit 204.

Thereafter, as illustrated in FIG. 5B, the signal is read from the pixel 100 of the (n+1)th row. This operation is similar to that from the time point t1 to the time point t11, so that description thereof is omitted.

As described above, the state is not the zero biased state from the time point t1 to the time point t4 and from the time point t7 to the time point t10 during which the potential supply line Vres(n) is at a low level. Thus, dark current is generated during this time. In the present modification example, the well region 109 is provided row by row and the potential supply line Vres is controlled row by row, so that dark current generated in the (n)th row is not read as a signal in the (n+1)th row. The same applies to the subsequent reading rows. The same also applies to the cases in which the semi-global shutter operation described above is conducted in the modification example illustrated in FIG. 3C. In the modification example illustrated in FIG. 3C, the dark current generation period is set shorter than that in the example illustrated in FIGS. 3A and 3B and thus the influence on the signals is reduced.

[Description of Pixel Circuit]

FIG. 6A schematically illustrates a structure of the pixel 100 of the semiconductor apparatus APR according to a second exemplary embodiment. Portions that have the same functions as those in FIG. 2A are given the same reference numerals. Only the differences from the first exemplary embodiment are described.

In the second exemplary embodiment, the semiconductor apparatus APR while the potential supplier 170 connected to the well region 109 is referred to as a first potential supplier, a second potential supplier 180 is connected to the floating diffusion region 110. The potential supplier 180 supplies, to the floating diffusion region 110, a potential that is different from the potential supplied from the potential supplier 170 to the well region 109. In the second exemplary embodiment, a control capacitor 112 configured to control the bias of the node B is included. The control capacitor 112 is set to a capacitance value Cp. As illustrated in FIG. 6A, a first terminal of the control capacitor 112 is connected to the node B. A second terminal of the control capacitor 112 is connected to the potential supplier 180, and a voltage Vp is supplied to the second terminal. As described above, the potential supplier 180 is connected to the floating diffusion region 110 via the control capacitor 112. The potential supplier 180 controls the voltage of the node B via the control capacitor 112. A ground potential is supplied from the potential supplier 170 to the well region 109 and the drain of the reset transistor 108 via the node C.

In the second exemplary embodiment, the ground potential is supplied to the drain of the reset transistor 108 and the well region 109 via the node C, and the potential supplier 180 controls the voltage of the node B via the control capacitor 112, as described above. The ground potential is supplied to the drain of the reset transistor 108 and the well region 109 via the node C so that variations in dark current reduction by zero bias resetting in each pixel are reduced. Further, the potential supplier 180 controls the voltage of the node B so that the pixel transistor is operated to conduct signal reading.

Next, the planar and cross-sectional structures of the semiconductor apparatus APR in the second exemplary embodiment will be described.

Figure 7A:
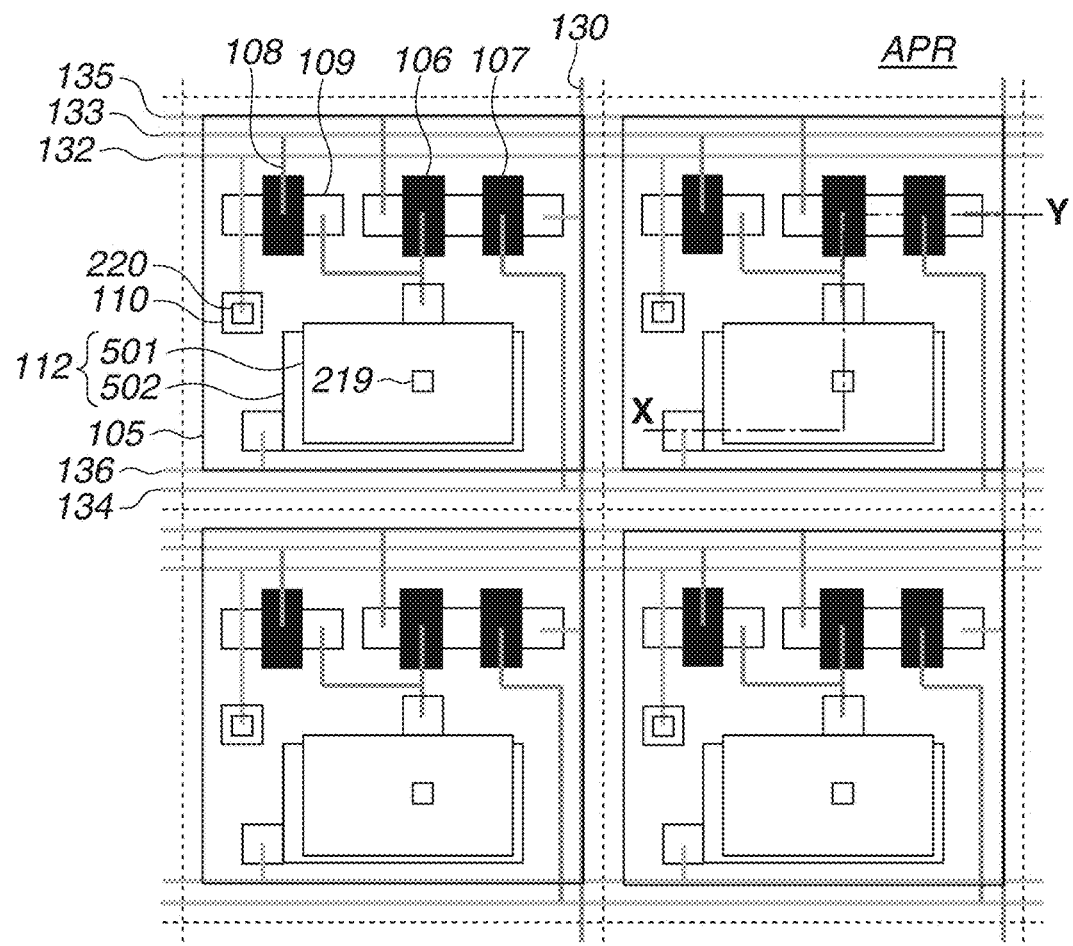
FIGS. 7A and 7B are schematic diagrams illustrating a semiconductor apparatus.

FIG. 7A schematically illustrates a planar structure of four pixels 100 arranged in an array of two rows and two columns in the second exemplary embodiment. The other pixels 100 have a similar planar structure. In FIG. 7A, the photoelectric conversion portion stacked above the pixel electrode 105 is not illustrated.

Figure 7B:
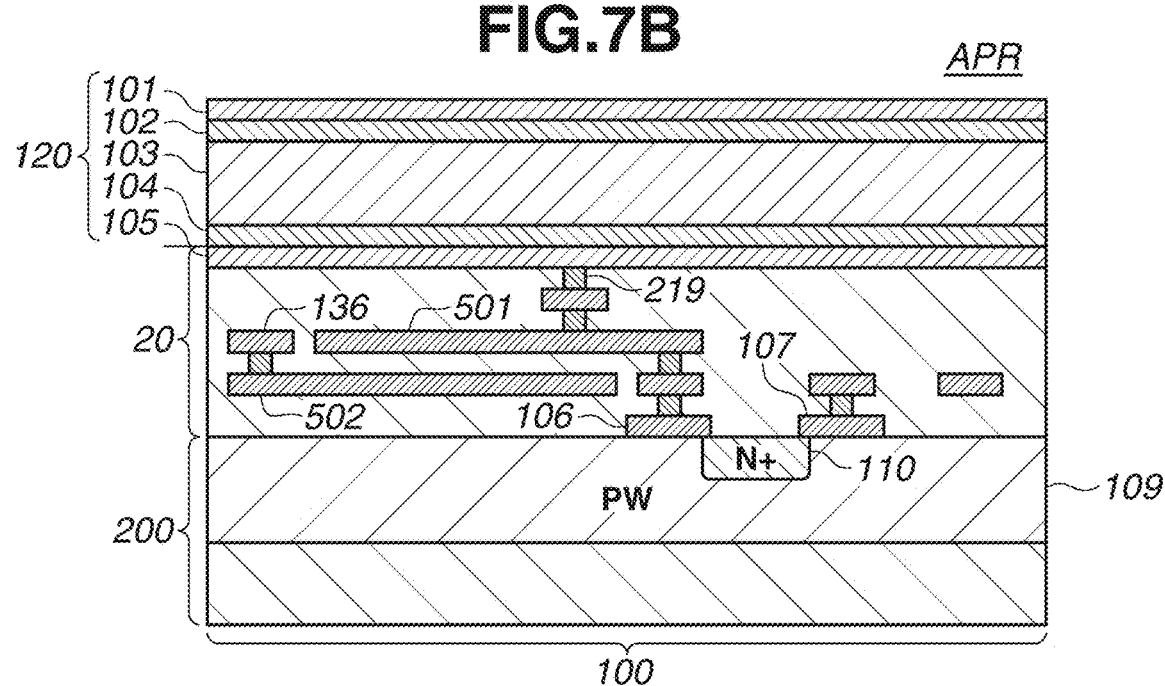

FIG. 7B schematically illustrates a cross-sectional structure of the pixel 100 of the semiconductor apparatus APR along a dot-dash line X-Y in FIG. 7A. Portion having similar functions to those in FIG. 2A are given the same reference numerals. Only the differences from the first exemplary embodiment will be described below. The reference numeral of a transistor is given to the corresponding gate. In FIG. 7B, the photoelectric conversion portion stacked above the pixel electrode 105 is also illustrated.

The structure of the pixel 100 will be described below with reference to FIGS. 7A and 7B. The control capacitor 112 includes an upper electrode 501 and a lower electrode 502. The upper electrode 501 and the lower electrode 502 face each other across an insulation member disposed therebetween. With this structure, the degree of design freedom of the capacitance value of the control capacitor 112 can be increased. This is because the planar shapes of the upper electrode 501 and the lower electrode 502 can be determined with ease using a semiconductor process such as lithography. Alternatively, any other structure can be employed for the control capacitor 112. In an alternative example, a p-n junction capacitor having a larger capacitance value than a predetermined value may be used.

Further, the upper electrode 501 and the lower electrode 502 of the control capacitor 112 are provided in the wiring layer 202 located below the pixel electrode 105 of the photoelectric conversion portion 120. The upper electrode 501 and the lower electrode 502 at least partially overlap the common electrode 101 or the pixel electrode 105 in the planar view. With this structure, the pixel size can be reduced. Further, the upper electrode 501 and the lower electrode 502 each include a portion that overlaps neither the reset transistor 108 nor the amplification transistor 106.

The control capacitor 112 in the second exemplary embodiment is, for example, a metal insulator metal (MIM) capacitor. More specifically, the upper electrode 501 and the lower electrode 502 are each formed using a conductive member such as metal. Alternatively, the control capacitor 112 may be a polysilicon (poly-si) insulator poly-si (PIP) capacitor. More specifically, the upper electrode 501 and the lower electrode 502 are each formed using a poly-si. Alternatively, the control capacitor 112 may be a metal-oxide-semiconductor (MOS) capacitor. More specifically, the upper electrode 501 is formed using a conductive member that exhibits metallic properties, such as metal or polysilicon in which high-concentration impurity is doped, and the lower electrode 502 is formed using a semiconductor region.

A potential supply line 136 configured to supply a bias potential is connected to the lower electrode 502 of the control capacitor 112. The potential supply line 132 configured to supply the reset potential Vres is connected to the drain of the reset transistor 108 and the well region 109.

[Description of Semi-Global Shutter Operation]

Next, a method of driving the semiconductor apparatus APR in the second exemplary embodiment will be described.

FIG. 6B is a timing chart of a driving signal used in the semiconductor apparatus APR in the present exemplary embodiment. For simplification, the driving signals corresponding to the signal reading operations of two rows, the (n)th and (n+1)th rows, are illustrated in FIG. 6B. The semi-global shutter operation is basically similar to the semi-global shutter operation in the first exemplary embodiment, so that only the differences from the first exemplary embodiment will be described below.

In the semi-global shutter operation in the second exemplary embodiment, the potential supply line 132 supplies the ground potential as the reset potential Vres to the node C.

During the time from the time point t1 to the time point t2, the voltage Vs1 (e.g., 3.3 V) is applied to the common electrode 101 of each of the rows so that the photoelectric conversion portion 120 is changed to the photoelectric conversion mode region illustrated in FIG. 4A. Further, at the same time, the voltage Vp(n) is changed to a low level, and the potential of the node B is lowered via the control capacitor 112. At this time, the state becomes zero bias resetting. Meanwhile, photoelectric conversion is simultaneously conducted with respect to all the pixels 100, and optical signal charges are accumulated in the pixel electrodes 105 (global exposure).

At the time point t2, the voltage Vs2 (e.g., 0 V) is applied to the common electrode 101 of each of the rows so that the photoelectric conversion portion 120 is changed to the global shutter mode. During this time, the sensitivities of the photoelectric conversion portions 120 of all the pixels 100 are simultaneously zero.

At the time point t3, the voltage Vp(n) is changed to a high level, and the potential of the node B is raised via the control capacitor 112. At this time, the amplification transistor 106 becomes operable. Further, the state is no longer zero bias resetting state. At the same time, the driving signal pSEL(n) is changed to a high level, and the selection transistor 107 of the pixel 100 of the (n)th row is turned on. Thus, the amplification transistor 106 of the pixel 100 of the (n)th row outputs a signal.

At the time point t4, the driving signal pTS(n) is changed to a high level, and at the time point t5, the driving signal pTS(n) is changed to a low level. With this operation, the signal S containing the optical signal accumulated in the node B and a threshold value variation of the amplification transistor 106 is held in the capacitor CTS of the column circuit 140.

At the time point t6, the voltage Vp is changed to a low level, and the potential of the node B is lowered via the control capacitor 112. At this time, the state becomes zero bias resetting state again.

At the time point t7, the driving signal pRes(n) is changed to a high level, and the reset transistor 108 of the pixel 100 of the (n)th row is turned on. With this operation, the node B of the pixel 100 of the (n)th row is reset. Thereafter, at the time point t8, the driving signal pRES(n) is changed to a low level, and the reset transistor 108 is turned off.

At the time point t9, the voltage Vp is changed to a high level, and the potential of the node B is raised via the control capacitor 112. At this time, the amplification transistor 106 becomes operable. At this time, the state is no longer zero bias resetting state.

Thereafter, at the time point t10, the driving signal pTN(n) is changed to a high level, and at the time point t11, the driving signal pTN(n) is changed to a low level. With this operation, the signal N containing a threshold value variation of the amplification transistor 106 is held in the capacitor CTN of the column circuit 140.

At the time point t12, the voltage Vp is changed to a low level, and the potential of the node B is lowered via the control capacitor 112. At this time, the state becomes zero bias resetting state.

At the time point t13, the driving signal pSEL(n) is changed to a low level, and the signal reading from the pixel 100 of the (n)th row to the column circuit 140 is finished.

The noise signal N and the optical signal S read by the column circuit 140 are output column by column to the amplification unit 203 based on the driving signal CSEL. The amplification unit 203 outputs the difference between the signals S and N to the ADC unit 204.

At the time point t14, the driving signal pSEL(n+1) is changed to a high level, and the selection transistor 107 of the pixel 100 of the (n+1)th row is turned on. Thereafter, the signal reading from the pixel 100 of the (n+1)th row is conducted. This operation is similar to that during the period from the time point t2 to the time point t13, so that description thereof is omitted.

During the signal reading of each row, the voltage Vs2 is applied to the common electrode 101 of each of the rows, and the state is set to the shutter state. Similarly, the signal reading is conducted up to the last row.

Thereafter, the voltage Vs1 (e.g., 0 V) is applied to the common electrode 101 of each of the rows so that the photoelectric conversion portion 120 is changed to the photoelectric conversion mode again. During this period, all the pixels are simultaneously set to the photoelectric conversion mode (global exposure).

As described above, the state is not the zero biased state from the time point t3 to the time point t6 and from the time point t9 to the time point t12 during which the voltage Vp(n) is at a high level. Thus, dark current is generated during this period. In the present exemplary embodiment, the voltage Vp is controlled row by row, so that dark current generated in the (n)th row is not read as a signal in the (n+1)th row. The same applies to the subsequent reading rows. In the second exemplary embodiment, the dark current generation period is set shorter than that in the first exemplary embodiment and thus the influence on the signals is reduced. While the semi-global shutter operation is described above as in the first exemplary embodiment, the global shutter operation is also possible if a memory configured to hold the signal charges is included.

In a third exemplary embodiment, a structure in which a row is selectable without using the selection transistor 107 will be described. Description of those that are similar to the second exemplary embodiment is omitted, and only the differences will be described below. In the third exemplary embodiment, the potential supplier 180 controls the node B via the control capacitor 112 so that row selection is conducted. More specifically, the potential supplier 180 executes control to turn on and off the signal output from the amplification transistor 106 to the output signal line 130. This allows omission of the selection transistor and pSEL control line, compared to the second exemplary embodiment.

The functions of the control capacitor 112 and the potential supplier 180 in the present modification example will be described below in detail with reference to the drawings.

Figure 8A:
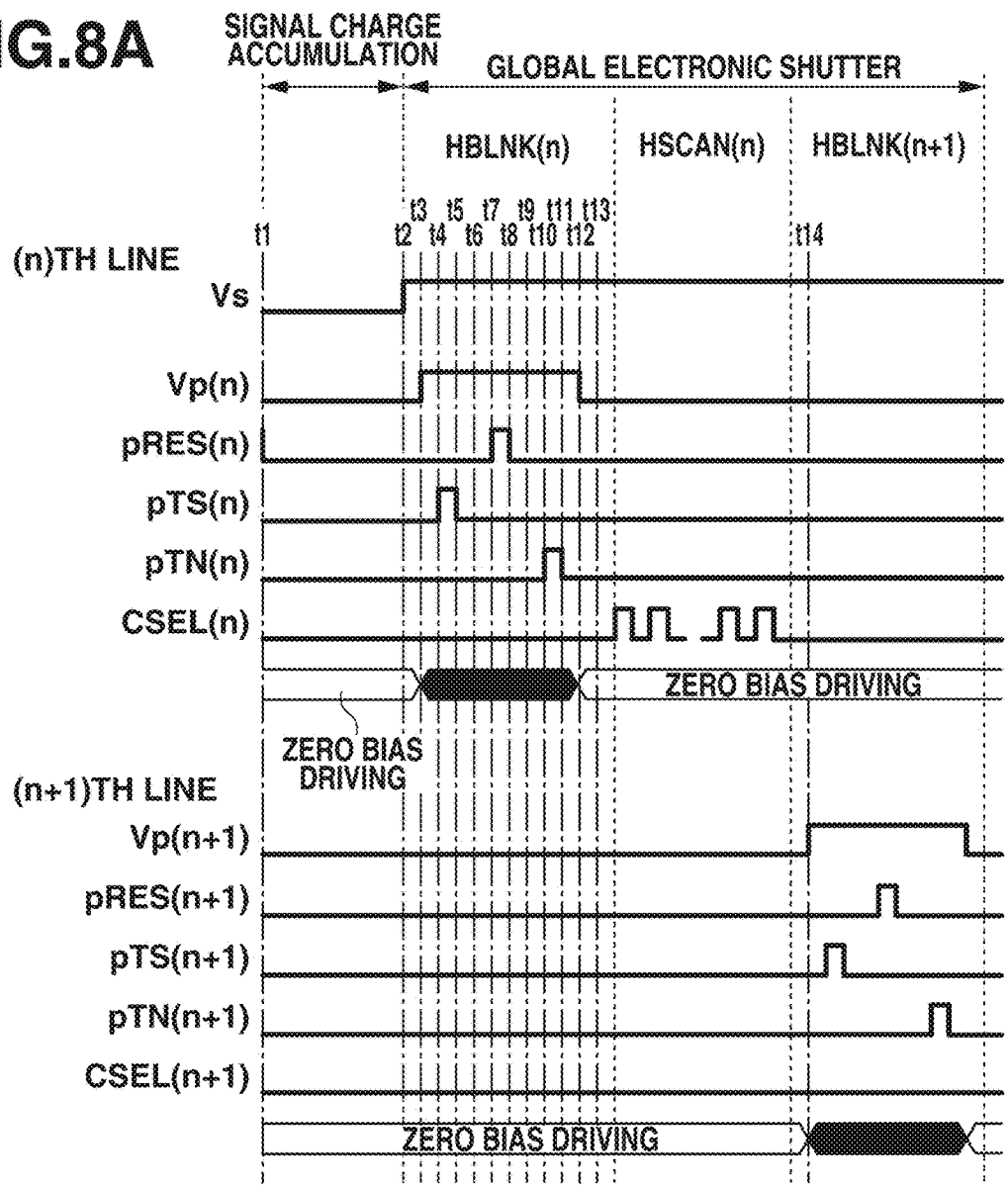
FIGS. 8A and 8B are schematic diagrams illustrating a semiconductor apparatus.
Figure 8B:
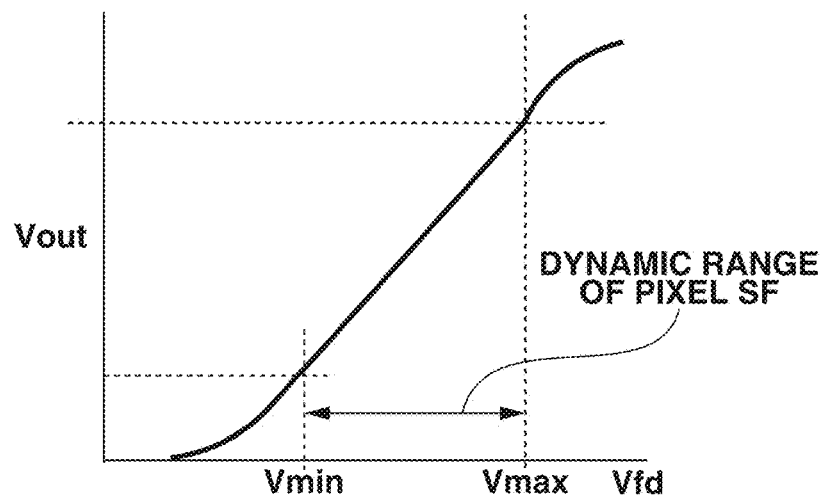

FIG. 8B is a schematic diagram illustrating a relationship between an input voltage (floating diffusion (FD) voltage) Vfd and an output voltage Vout of a pixel source follower circuit formed by the amplification transistor 106 and the current source 150. A minimum value Vmin indicates the minimum value of a dynamic range in which the pixel source follower circuit is ensured linearity, and a maximum value Vmax indicates the maximum value of the dynamic range. The P-type semiconductor substrate is set to GND (0 V), and the minimum value Vmin and the maximum value Vmax are respectively 1.5 V and 2.5 V.

In the third exemplary embodiment, the signal charge is based on hole. The reset voltage of the pixel electrode 105 and the floating diffusion region 110 are to be set to a value not less than the minimum value Vmin in order to ensure the linearity of the circuit. Thus, the reset voltage is set to 1.5, and the pixel electrode 105 and the floating diffusion region 110 are reset. As the holes are accumulated in the floating diffusion region 110, the voltage of the floating diffusion region 110 increases. A saturation voltage that is determined by the dynamic range of the reading circuit is 2.5 V (maximum value Vmax).

The potential of the floating diffusion region 110 connected to the pixel electrode 105 immediately after the resetting is 1.5 V, and the potential of the P-type semiconductor substrate 200 is 0 V, so that the state is the reverse biased state of 1.5 V, which is a condition in which the amount of leak current is significantly large. On the other hand, if the reset potential is set to a value close to 0 V in order to conduct the zero bias resetting, the reset voltage no longer stays within the dynamic range of the reading system.

Thus, in the third exemplary embodiment, the reset voltage is set to a value (1.5 V in the present exemplary embodiment) within the dynamic range of the reading circuit. Then, during signal accumulation, the potentials of the pixel electrode 105 and the floating diffusion region 110 are lowered by the control by the control capacitor 112 and the potential supplier 180 so that an operation point is shifted to a value close to 0 V. At the time of reading, the potentials of the pixel electrode 105 and the floating diffusion region 110 are raised so that the shift is returned and the value is brought within a normal dynamic range, to read a signal. In this way, the signal reading is conducted correctly while the leak current is reduced. The zero bias resetting operation of the pixel electrode 105 can be conducted without the FD potential in the signal reading being affected by the dynamic range of the pixel source follower circuit.

The amount (range of lowering, range of raising) of control of the voltage of the node B by the control capacitor 112 and the potential supplier 180 is determined based on the ratio between the capacitance value Cp of the control capacitor 112 and the capacitance value CB of the capacitor of the node B with respect to an amount of change dVp in the voltage Vp. The amount of change dVB in the voltage of the node B is expressed as dVB=dVp×Cp/(Cp+Cb). The capacitance value CB of the capacitor of the node B includes capacitor values such as the capacitor value of a capacitor of the photoelectric conversion portion 120 and the capacitor value of a parasitic capacitor near the node B. In the third exemplary embodiment, the capacitor value of the capacitor of the photoelectric conversion portion 120 is dominant in the capacitance value CB of the capacitor of the node B. By designing the capacitance value Cp of the control capacitor 112 appropriately, the amount of change dVB in the voltage of the node B can be controlled.

While the case in which the signal charge is based on holes and the pixel transistor is an NMOS transistor is described in the third exemplary embodiment, a similar benefit can also be obtained by a structure in which the signal charge is based on electrons and the pixel transistor is a P-channel MOS (PMOS) transistor.

[Description of Semi-Global Shutter Operation]

FIG. 8A is a timing chart of a driving signal used in the semi-global shutter operation of the semiconductor apparatus APR according to the third exemplary embodiment. The semi-global shutter operation is basically similar to the semi-global shutter operation in the second exemplary embodiment, so that only the differences from the second exemplary embodiment will be described below.

At the time point t3, the voltage Vp(n) is a high level Vp2 (e.g., 1.5 V). At this time, the potential of the node B is raised via the control capacitor 112. With this operation, the node B and the floating diffusion region 110 are changed from the zero bias resetting state and set to a reading state within the dynamic range of the pixel source follower circuit formed by the amplification transistor 106 and the current source 150, as described above with reference to FIG. 8B. At this time, the pixel source follower circuit of the (n)th row is changed to an operation state. The pixel source follower circuits of the other rows are in a non-operation state. In other words, the voltage Vp(n) is set to the high level Vp2 (e.g., 1.5 V) to thereby conduct a selection operation to select the (n)th row.

At the time point t4, the driving signal pTS(n) is changed to a high level, and at the time point t5, the driving signal pTS(n) is changed to a low level. During this time, the signal S containing the optical signal accumulated in the node B and a threshold value variation of the amplification transistor 106 is held in the capacitor CTS of the column circuit 140.

At the time point t7, the reset signal pRES(n) is changed to a high level, and at the time point t8, the reset signal pRES(n) is changed to a low level. During this time, the voltage Vp(n) is maintained at the high level Vp2 (e.g., 1.5 V), so that the signal charges of the node B and the floating diffusion region 110 are reset.

Thereafter, at the time point t10, the driving signal pTN(n) is changed to a high level, and at the time point t11, the driving signal pTN(n) is changed to a low level. During this time, the signal N containing a threshold value variation of the amplification transistor 106 is held in the capacitor CTN of the column circuit 140.

At the time point t12, the voltage Vp(n) is changed to a low level Vr1 (e.g., 0 V). At this time, the potentials of the node B and the floating diffusion region 110 are lowered via the control capacitor 112. With this operation, the node B and the floating diffusion region 110 are set to the zero bias resetting state and no longer stay within the dynamic range of the pixel source follower circuit formed by the amplification transistor 106 and the current source 150. As a result, the pixel source follower circuit of the (n)th row is changed to the non-operation state and thus a non-selection operation is realized.

The function of the selection transistor 107 can be substituted by the operation of controlling the voltage Vp(n) to Vp1 and Vp2, so that the selection transistor 107 and the pSEL signal line can be omitted. As a result, the pixel area is further reduced.

Figure 9A:
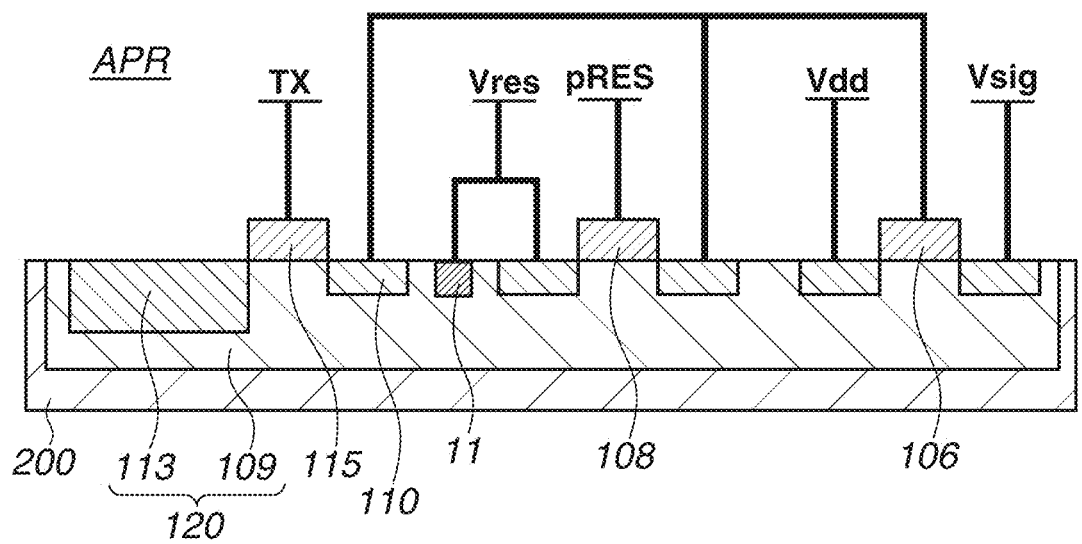
FIGS. 9A and 9B are schematic diagrams illustrating a semiconductor apparatus.
Figure 9B:
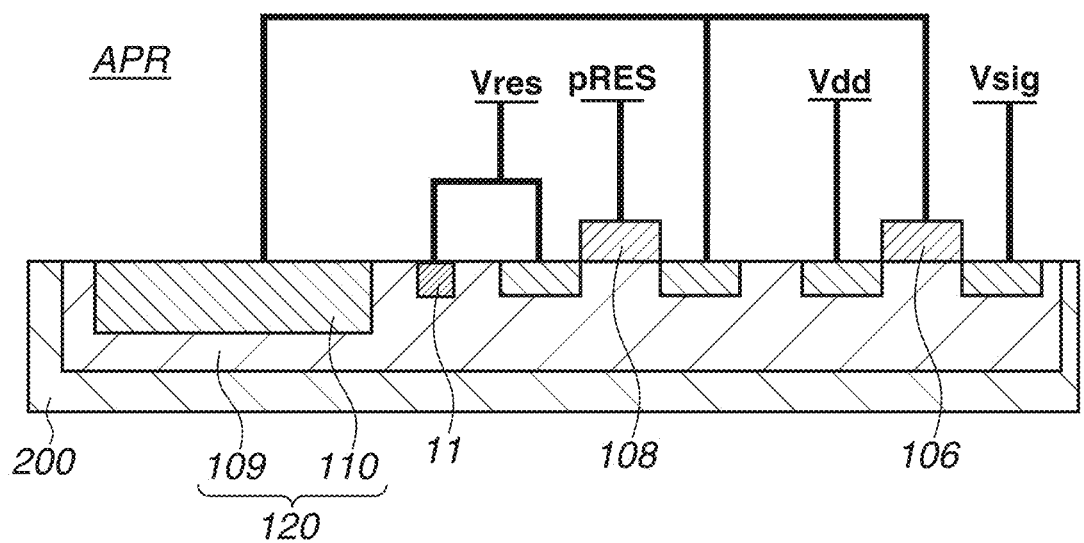

FIGS. 9A and 9B are cross-sectional views illustrating a semiconductor apparatus APR according to a fourth exemplary embodiment. In the fourth exemplary embodiment, the photoelectric conversion portion 120 provided in the semiconductor substrate 200 including the floating diffusion region 110 and the well region 109 is included. The fourth exemplary embodiment is similar to the first to third exemplary embodiments in that the potential of the floating diffusion region 110 is changed based on light incident on the photoelectric conversion portion 120.

In an example illustrated in FIG. 9A, the photoelectric conversion portion 120 includes the well region 109, which is a P-type semiconductor region, and a charge accumulation region 113, which is an N-type semiconductor region and forms a p-n junction with the well region 109. Charge generated by photoelectric conversion is accumulated in the charge accumulation region 113 and transferred to the floating diffusion region 110 via a transfer gate 151 that is controlled to be turned on and off by a transfer signal TX. A potential based on the amount of charge transferred to the floating diffusion region 110 and the junction capacitance of the p-n junction formed by the floating diffusion region 110 and the well region 109 appears in the floating diffusion region 110. As described above, in the example illustrated in FIG. 9A, the semiconductor substrate 200 includes the transfer transistor including the transfer gate 151 as a gate, the charge accumulation region 113 as a source, and the floating diffusion region 110 as a drain.

In an example illustrated in FIG. 9B, the photoelectric conversion portion 120 includes the well region 109, which is a P-type semiconductor region, and the floating diffusion region 110, which is an N-type semiconductor region and forms a p-n junction with the well region 109. The floating diffusion region 110 is also a photoelectric conversion region of the photoelectric conversion portion 120, and charge generated by photoelectric conversion in the floating diffusion region 110 is accumulated in the floating diffusion region 110.

In each of FIGS. 9A and 9B, the well region 109 and the source (or drain) of the reset transistor 108 are connected. Further, the floating diffusion region 110 and the drain (or source) of the reset transistor 108 are connected. If the reset transistor 108 is turned on by the reset signal pRES input to the gate of the reset transistor 108, the reset potential Vres is supplied to the floating diffusion region 110 and the well region 109, and the zero bias resetting is executed. In each of FIGS. 9A and 9B, the well region 109 and the reset transistor 108 are connected via a contact region 11 which is of the P+ type and has a higher impurity concentration than the well region 109 which is of the P type. The contact region 11 can have a function and structure similar to those of the contact region 111 in the first to third exemplary embodiments.

In another example, the charge accumulation region 113 and a semiconductor layer (photoelectric conversion layer) including the transfer gate 151 can be stacked on a semiconductor substrate that is different from the semiconductor layer. In this case, the row driving circuit 201, the column circuit 140, the column driving circuit 141, the amplification unit 203, and the ADC unit 204 can be provided to the semiconductor substrate. The reset transistor 108 and the amplification transistor 106 can be provided to the semiconductor layer including the floating diffusion region 110 or the semiconductor substrate different from the semiconductor layer.

Figure 10:
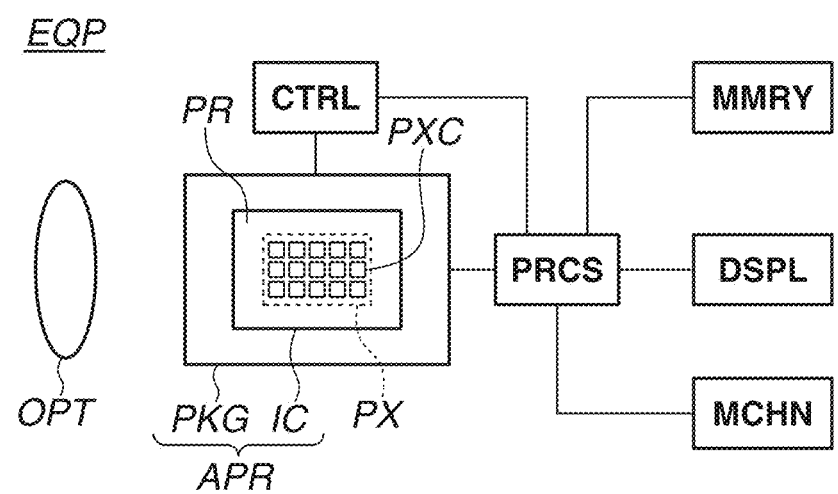
FIG. 10 is a schematic diagram illustrating a semiconductor apparatus.

FIG. 10 is a block diagram schematically illustrating the semiconductor apparatus APR. FIG. 10 illustrates an equipment EQP including the semiconductor apparatus APR. The semiconductor apparatus APR includes a semiconductor device IC including the semiconductor substrate 200 and a package PKG for mounting the semiconductor apparatus IC. The package PKG can include a substrate to which the semiconductor device IC is fixed, a cover made of a material such as glass facing the semiconductor apparatus IC, and a connection member such as a bonding wire or bump for connecting a terminal provided to the substrate and a terminal provided to the semiconductor apparatus IC. The semiconductor apparatus APR in the above-described exemplary embodiments is a photoelectric conversion apparatus. The semiconductor apparatus IC includes a pixel region PX in which a matrix array of pixel circuit PXC is arranged and a peripheral region PR around the pixel region PX. A peripheral circuit can be provided in the peripheral region PR.

The equipment EQP can further include at least one of an optical system OPT, a control apparatus CTRL, a processing apparatus PRCS, a display apparatus DSPL, a storage apparatus MMRY, and a mechanical apparatus MCHN. The optical system OPT forms an image on the semiconductor apparatus APR, and includes, for example, a lens, shutter, and mirror. The control apparatus CTRL controls the semiconductor apparatus APR and is, for example, a photoelectric conversion apparatus such as an application-specific integrated circuit (ASIC). The processing apparatus PRCS processes a signal output from the semiconductor apparatus APR and is a photoelectric conversion apparatus such as a central processing unit (CPU) or ASIC for forming an analog front end (AFE) or digital front end (DFE). The display apparatus DSPL displays information (image) acquired by the semiconductor apparatus APR and is an electroluminescent (EL) display apparatus or liquid crystal display apparatus. The storage apparatus MMRY stores the information (image) acquired by the semiconductor apparatus APR and includes a magnetic device or semiconductor device. The storage apparatus MMRY is a volatile memory, such as a static random access memory (SRAM) or dynamic RAM (DRAM), or a non-volatile memory, such as a flash memory or hard disk drive. The mechanical apparatus MCHN includes a movable or driving unit, such as a motor or engine. The equipment EQP displays a signal output from the semiconductor apparatus APR on the display apparatus DSPL and transmits the signal to external equipment using a communication apparatus (not illustrated) of the equipment EQP. Thus, the equipment EQP may further includes the storage apparatus MMRY and the processing apparatus PRCS besides a storage circuit and computation circuit of the semiconductor apparatus APR. The mechanical apparatus MCHN may be controlled based on the signal output from the semiconductor apparatus APR.

The equipment EQP illustrated in FIG. 10 can be an electronic apparatus having an image capturing function, such as an information terminal (e.g., smartphone, and wearable terminal) or camera (e.g., interchangeable lens camera, compact camera, video camera, and monitoring camera). The mechanical apparatus MCHN in a camera can drive components of the optical system OPT for zooming, focusing, and shutter operations. Further, the equipment EQP can be a transportation equipment such as a vehicle, ship, or aircraft. The mechanical apparatus MCHN in a transportation equipment can be used as a moving equipment. The equipment EQP as a transportation equipment is suitable for use in transporting the semiconductor apparatus APR, assisting in and/or automating the driving (controlling) using the image capturing function. The processing equipment PRCS for assisting in and/or automating the driving (controlling) can execute processing to operate the mechanical apparatus MCHN as a moving apparatus based on information acquired by the semiconductor apparatus APR. Alternatively, the equipment EQP can be a medical equipment, such as an endoscope or radiation diagnosis equipment, a measurement equipment, such as a distance measurement sensor, or an analysis equipment such as an electronic microscope.

Use of the semiconductor apparatus APR according to the present exemplary embodiment makes it possible to improve the performance of the semiconductor apparatus APR. Thus, excellent image quality and measurement accuracy are obtained when the semiconductor apparatus APR is mounted on the equipment EQP to capture images of the outside of the equipment EQP and to measure an external environment. Further, the reliability is increased so that the semiconductor apparatus APR is mountable on the equipment EQP. It is thus beneficial in manufacturing and selling the equipment EQP to determine that the semiconductor apparatus APR of the present exemplary embodiment is to be mounted on the equipment EQP for improving the performance of the equipment EQP.

While the examples in which the semiconductor apparatus that detects light using the photoelectric conversion portion 120 are described in the exemplary embodiments, the disclosure is applicable to not only a sensor configured to detect light but also various sensors configured to detect an electromagnetic wave, radiation, mechanical amount, heat, and chemical substance.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-004913, filed Jan. 16, 2018, which is hereby incorporated by reference herein in its entirety.

What is claimed is:

1. A semiconductor apparatus, comprising:
a first semiconductor region of a first conductive type in which a potential to be detected appears;
a second semiconductor region of a second conductive type that forms a p-n junction with the first semiconductor region;
a potential supplier connected to the second semiconductor region;
an amplification transistor including a gate to which the first semiconductor region is connected; and
a reset transistor configured to reset a potential of the first semiconductor region,
wherein one of a source and a drain of the reset transistor is connected to the first semiconductor region, and the other one of the source and the drain of the reset transistor is connected to the second semiconductor region, and
wherein the potential supplier supplies a first potential during a period in which the reset transistor is on, and the potential supplier supplies a second potential different from the first potential during a period in which the reset transistor is off.

2. The semiconductor apparatus according to claim 1, further comprising a transfer gate configured to transfer charge generated by a photoelectric conversion portion to the first semiconductor region.

3. A semiconductor apparatus comprising:
a first semiconductor region of a first conductive type in which a potential to be detected appears;
a second semiconductor region of a second conductive type that forms a p-n junction with the first semiconductor region;
an amplification transistor including a gate to which the first semiconductor region is connected;
a reset transistor configured to reset a potential of the first semiconductor region;
a first potential supplier connected to the second semiconductor region; and
a second potential supplier connected to the first semiconductor region,
wherein one of a source and a drain of the reset transistor is connected to the first semiconductor region, and the other one of the source and the drain of the reset transistor is connected to the second semiconductor region.

4. The semiconductor apparatus according to claim 3, wherein the first potential supplier supplies a first potential during a period in which the reset transistor is on, and the first potential supplier supplies a second potential different from the first potential during a period in which the reset transistor is off.

5. The semiconductor apparatus according to claim 3, wherein the first potential supplier supplies a ground potential to the second semiconductor region.

6. The semiconductor apparatus according to claim 3, wherein the second potential supplier supplies, to the first semiconductor region, a potential different from a potential supplied from the first potential supplier to the second semiconductor region.

7. The semiconductor apparatus according to claim 3, wherein the second potential supplier is connected to the first semiconductor region via a capacitor.

8. The semiconductor apparatus according to claim 3, wherein the second potential supplier executes control to turn on and off of a signal output from the amplification transistor to a signal line.

9. The semiconductor apparatus according to claim 3, further comprising a photoelectric conversion portion which is provided in a semiconductor substrate including the first semiconductor region and the second semiconductor region,
wherein information corresponding to light incident on the photoelectric conversion portion is to be detected.

10. The semiconductor apparatus according to claim 3, wherein the first semiconductor region is a floating diffusion region, and the second semiconductor region is a well region.

11. The semiconductor apparatus according to claim 3, wherein the amplification transistor forms a source follower circuit.

12. An equipment including the semiconductor apparatus according to claim 3, the equipment further comprising:
at least one of an optical system configured to form an image on the semiconductor apparatus,
a control apparatus configured to control the semiconductor apparatus,
a processing apparatus configured to process a signal output from the semiconductor apparatus,
a display apparatus configured to display information acquired by the semiconductor apparatus,
a storage apparatus configured to store the information acquired by the semiconductor apparatus, and
a mechanical apparatus controlled based on the signal output from the semiconductor apparatus.

13. A semiconductor apparatus comprising:
a first semiconductor region of a first conductive type in which a potential to be detected appears;
a second semiconductor region of a second conductive type that forms a p-n junction with the first semiconductor region;

an amplification transistor including a gate to which the first semiconductor region is connected;

a reset transistor configured to reset a potential of the first semiconductor region; and a photoelectric conversion layer provided above a semiconductor substrate including the first semiconductor region and the second semiconductor region, wherein one of a source and a drain of the reset transistor is connected to the first semiconductor region, and the other one of the source and the drain of the reset transistor is connected to the second semiconductor region, and wherein the potential to be detected changes based on an amount of light incident on the photoelectric conversion layer.

14. The semiconductor apparatus according to claim 13, further comprising a potential supplier connected to the second semiconductor region, wherein the potential supplier supplies a first potential during a period in which the reset transistor is on, and the first potential supplier supplies a second potential different from the first potential during a period in which the reset transistor is off.

15. The semiconductor apparatus according to claim 13 further comprising a potential supplier connected to the second semiconductor region, wherein the potential supplier is connected to the second semiconductor region via a conductive member.

16. The semiconductor apparatus according to claim 15, wherein the conductive member is connected to the second semiconductor region via a third semiconductor region of the second conductive type that has a higher impurity concentration than an impurity concentration of the second semiconductor region.

17. The semiconductor apparatus according to claim 13, further comprising a potential supplier connected to the second semiconductor region, wherein the potential supplier supplies a ground potential to the second semiconductor region.

18. The semiconductor apparatus according to claim 13, further comprising a first electrode and a second electrode which are arranged above the semiconductor substrate, wherein the photoelectric conversion layer is arranged between the first electrode and the second electrode, and the first electrode is connected to the first semiconductor region.

19. The semiconductor apparatus according to claim 18, wherein the first semiconductor region is a floating diffusion region, the second semiconductor region is a well region, and the amplification transistor forms a source follower circuit.

20. An equipment including the semiconductor apparatus according to claim 13, the equipment further comprising:
at least one of
an optical system configured to form an image on the semiconductor apparatus;
a control apparatus configured to control the semiconductor apparatus;
a processing apparatus configured to process a signal output from the semiconductor apparatus;
a display apparatus configured to display information acquired by the semiconductor apparatus;
a storage apparatus configured to store the information acquired by the semiconductor apparatus; and
a mechanical apparatus controlled based on the signal output from the semiconductor apparatus.

* * * * *